(12) United States Patent
Hirata

(10) Patent No.: US 7,729,396 B2
(45) Date of Patent: Jun. 1, 2010

(54) LASER DIODE DEVICE

(75) Inventor: Shoji Hirata, Kanagawa (JP)

(73) Assignee: Sony Corporation, Tokyo (JP)

( * ) Notice: Subject to any disclaimer, the term of this patent is extended or adjusted under 35 U.S.C. 154(b) by 103 days.

(21) Appl. No.: 11/303,128

(22) Filed: Dec. 15, 2005

(65) Prior Publication Data

US 2006/0203868 A1    Sep. 14, 2006

(30) Foreign Application Priority Data

Dec. 21, 2004    (JP) .............................. 2004-369128

(51) Int. Cl.
*H01S 3/13*   (2006.01)
*H01S 5/00*   (2006.01)

(52) U.S. Cl. ..................... 372/29.021; 372/29.022; 372/43.01

(58) Field of Classification Search .............. 372/43.01, 372/29.021, 29.022, 50.1
See application file for complete search history.

(56) References Cited

U.S. PATENT DOCUMENTS

| | | | | |
|---|---|---|---|---|
| 6,430,204 | B1 * | 8/2002 | Tanaka | 372/46.01 |
| 6,782,025 | B2 * | 8/2004 | Abeles | 372/46.01 |
| 6,891,872 | B1 * | 5/2005 | Hiroyama et al. | 372/45.01 |
| 2002/0185643 | A1 | 12/2002 | Uchida et al. | |
| 2003/0001238 | A1 * | 1/2003 | Ban | 257/627 |
| 2005/0030994 | A1 * | 2/2005 | Kozaki et al. | 372/43 |
| 2006/0078024 | A1 * | 4/2006 | Matsumura et al. | 372/46.01 |

FOREIGN PATENT DOCUMENTS

| | | |
|---|---|---|
| EP | 1583190 | 10/2005 |
| JP | 2000-114660 | 4/2000 |
| JP | 2002-124702 | 4/2002 |
| JP | 2002-246690 | 8/2002 |
| JP | 2000-244071 | 9/2002 |
| JP | 2002-299765 | 10/2002 |
| JP | 2003-318492 | 11/2003 |
| JP | 2004-172568 | 6/2004 |

OTHER PUBLICATIONS

Perlin, P. et al., "High power, pulse current operated, violet light emitting lasers grown on bulk GaN substrates," Novel In-Plane Semiconductor Lasers III, vol. 5365, pp. 26-28, 2004.*
Prystawko, P. et al, "High-power laser structures grown on bulk GaN crystals," Journal of Crystal Growth, vol. 272, pp. 274- 277, 2004.*

(Continued)

*Primary Examiner*—Armando Rodriguez
(74) *Attorney, Agent, or Firm*—K&L Gates LLP

(57) ABSTRACT

A laser diode device capable of obtaining high light efficiency and improving output by using an AlGaInN compound semiconductor as a material is provided. The laser diode device includes semiconductor layer which has an active layer and is made of a nitride Group III-V compound semiconductor containing at least one of aluminum (Al), gallium (Ga), and indium (In) among Group 3B elements and nitrogen (N) among Group 5B elements. The active layer has a strip-shaped light emitting region whose width W is from 5 μm to 30 μm, length L is from 300 μm to 800 μm, and output of laser light from the active layer is 200 mW or more.

8 Claims, 24 Drawing Sheets

OTHER PUBLICATIONS

European Search Report issued on Jun. 4, 2009, for corresponding European Patent Application 05292740.7.

Gokhale, M.R. et al., "Low-Threshold Current, High-Efficiency 1.3-μ Wavelength Aluminum-Free InGaAsN-Based Quantum-Well Lasers," IEEE Photonics Technology Letters, vol. 12, pp. 131-133, 2000.

Goto, S. et al., "Super high-power AlGaInN-based laser diodes with a single broad-area stripe emitter fabricated on a GaN substrate," PHYS. STAT. SOL., vol. 200, pp. 122-125, 2003.

Heffeman, J. et al., "InGaN violet laser diodes grown by molecular beam peitaxy," PHYS. STAT. SOL., vol. 201, pp. 2688-2671, 2004.

Kamiyama, S. et al., "UV Laser Diode with 350.9nm-Lasing Wavelength Grown on AlGaN Template," Semiconductor Laser Conference, pp. 67-68, 2004.

Pawel Prystawko et al., High-Power Laser Structures Grown on Bulk GaN Crystals, Journal of Crystal Growth, 2004, vol. 272, Issues 104, p. 274-277.

* cited by examiner

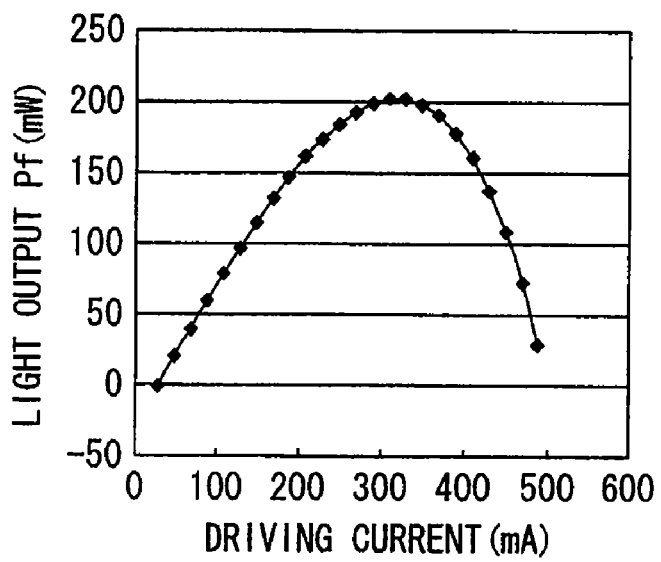
FIG. 3A  W=2μm
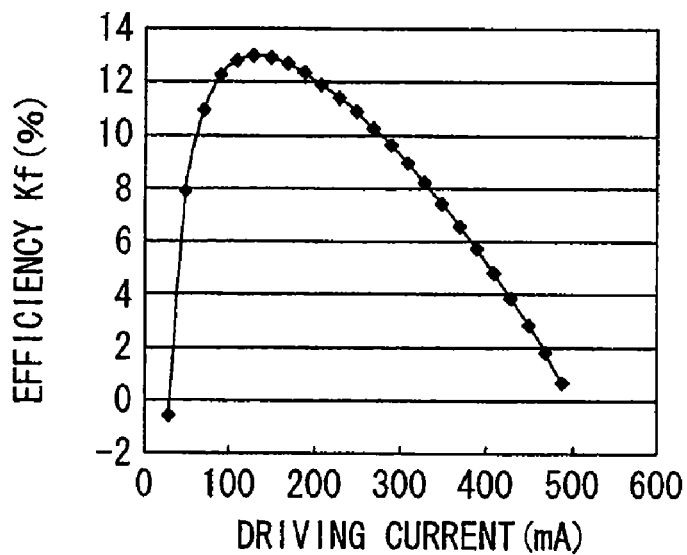
FIG. 3B  W=2μm
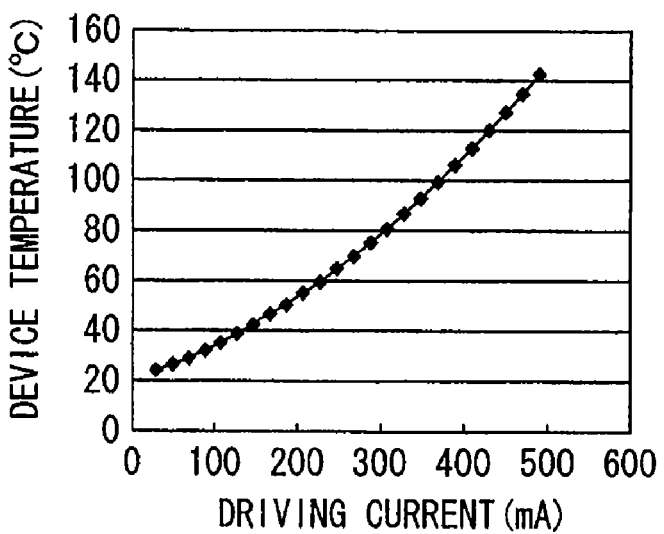
FIG. 3C  W=2μm

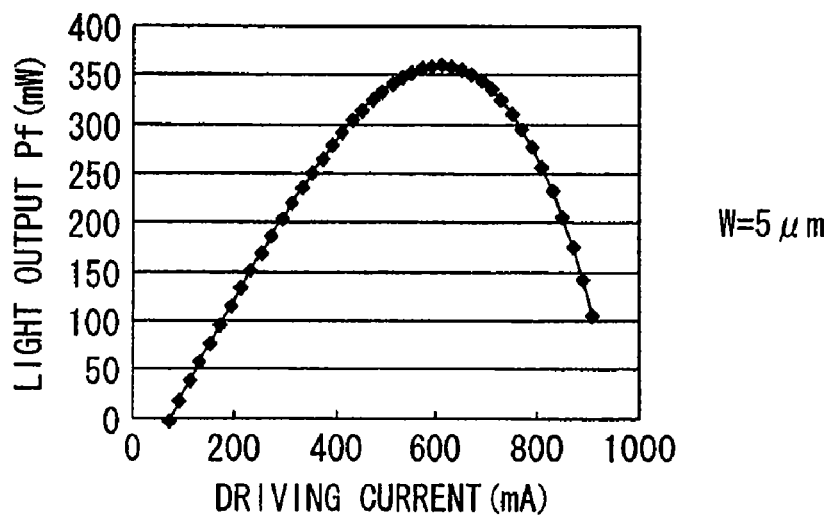
FIG. 4A   W=5 μm
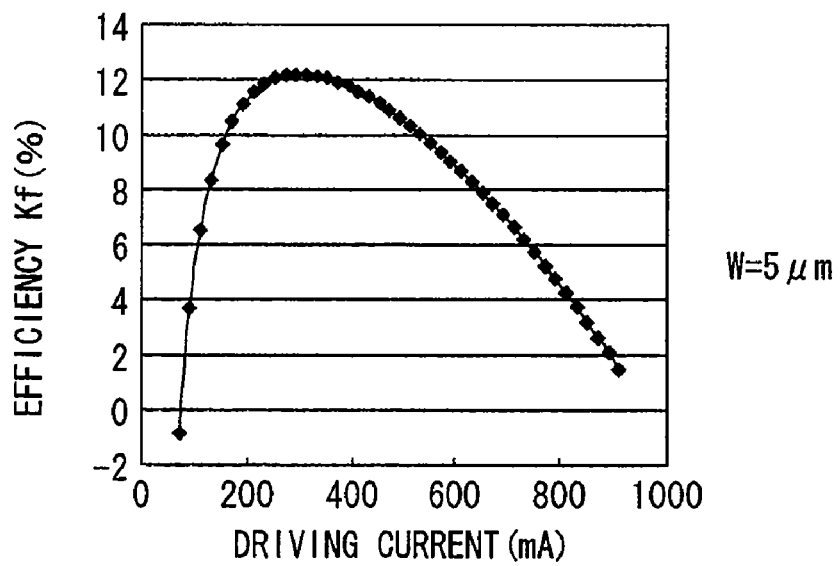
FIG. 4B   W=5 μm
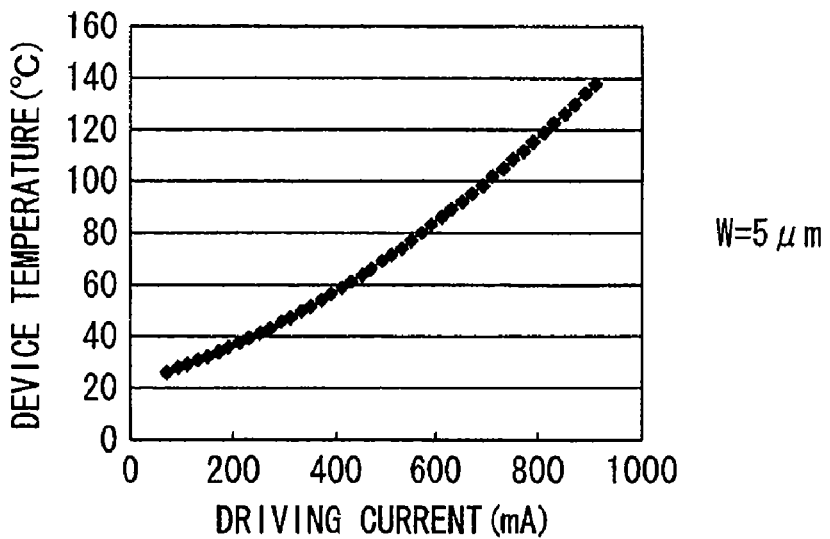
FIG. 4C   W=5 μm

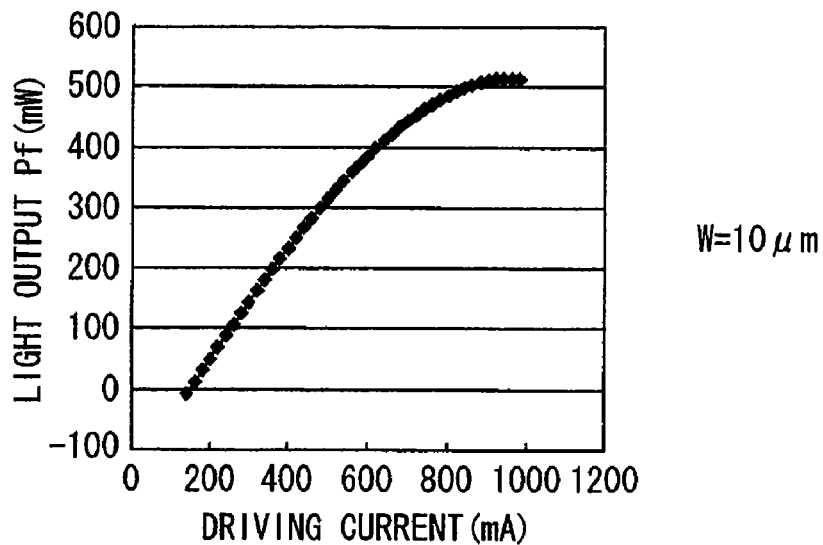
FIG. 5A  W=10 μm
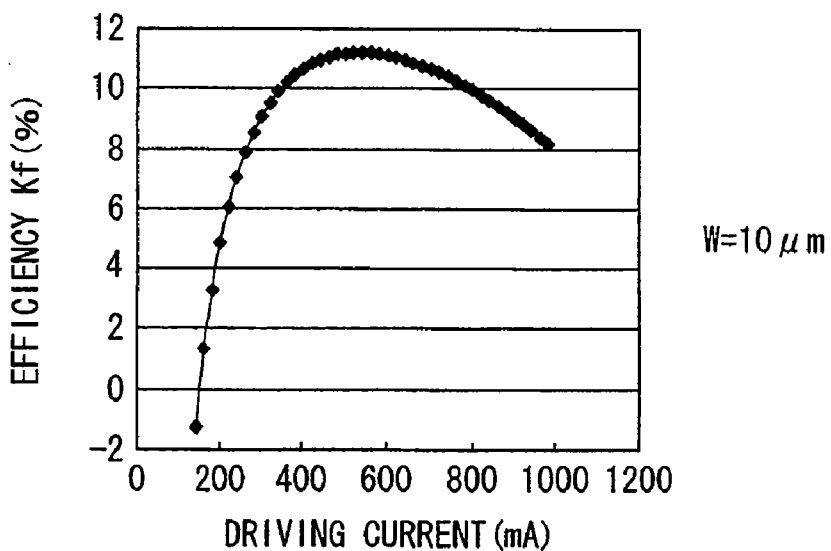
FIG. 5B  W=10 μm
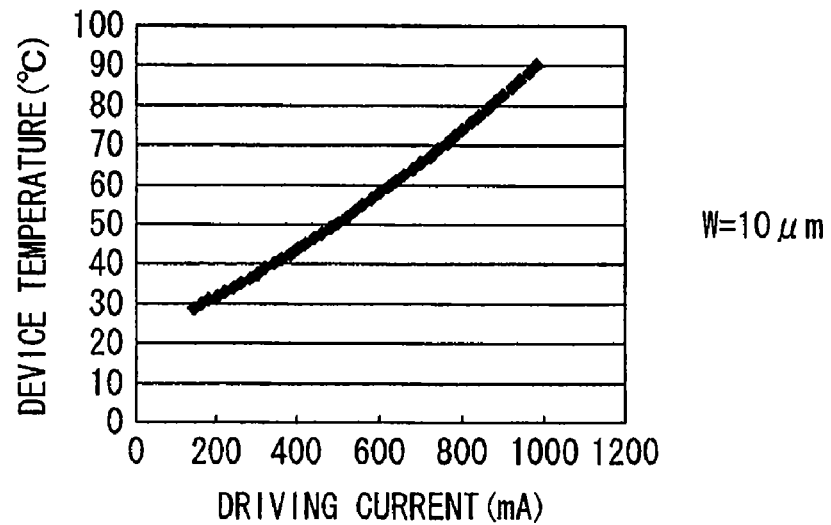
FIG. 5C  W=10 μm

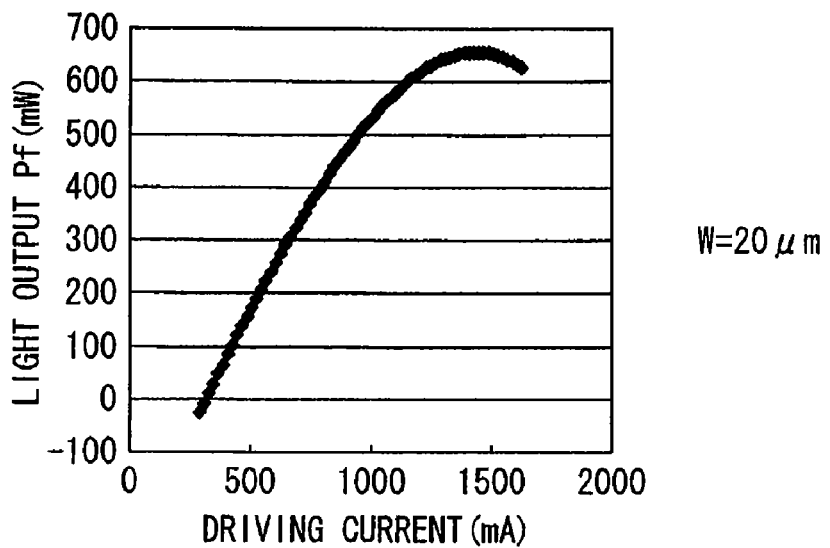
FIG. 6A  W=20 μm
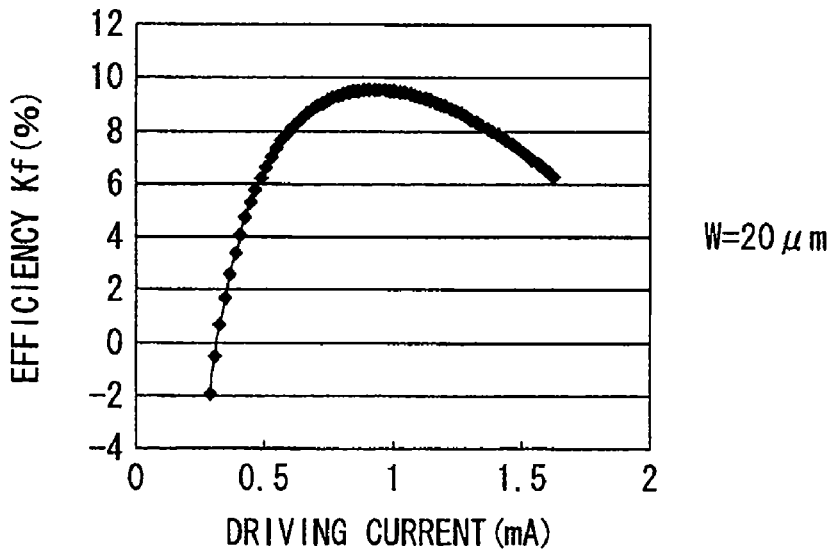
FIG. 6B  W=20 μm
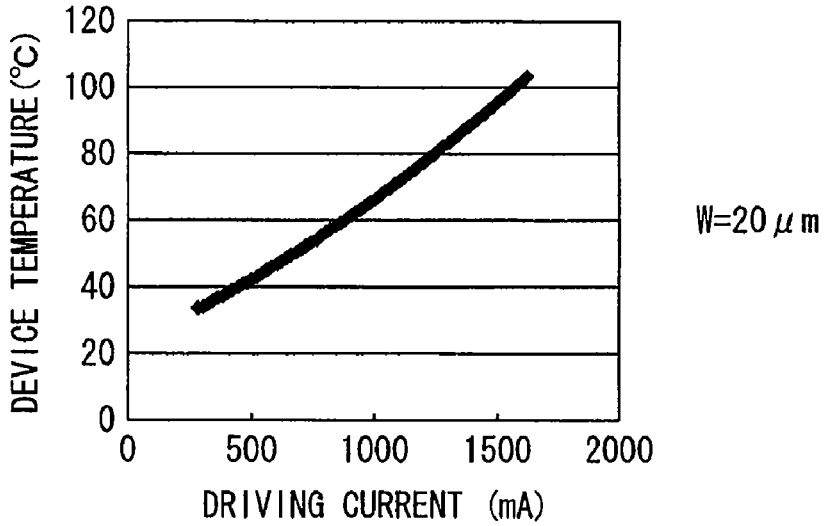
FIG. 6C  W=20 μm

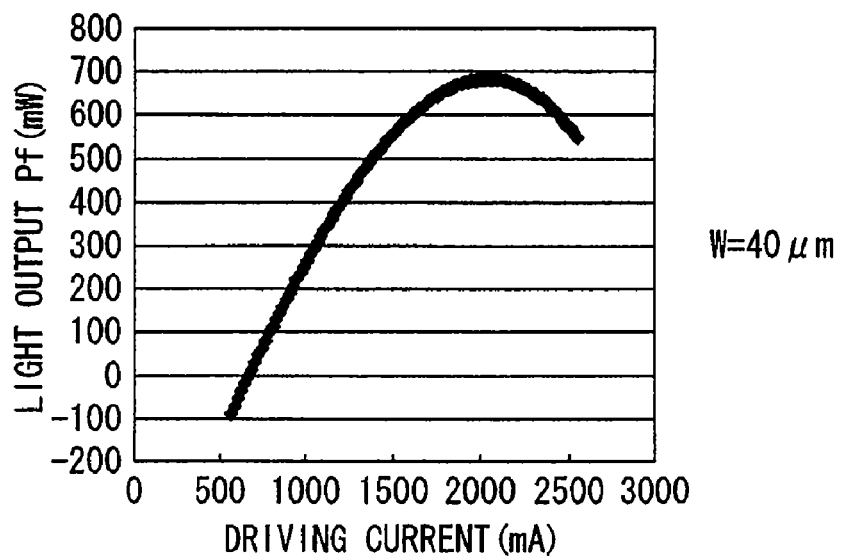
FIG. 7A  W=40 μm
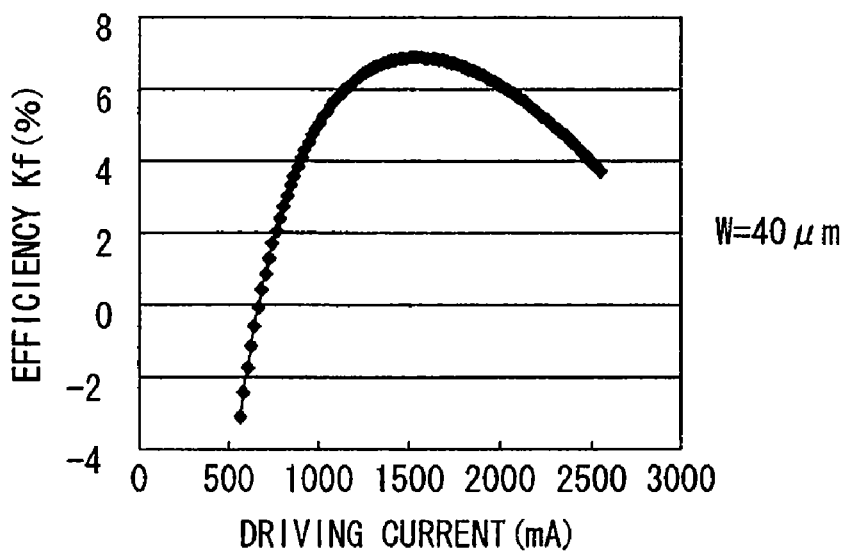
FIG. 7B  W=40 μm
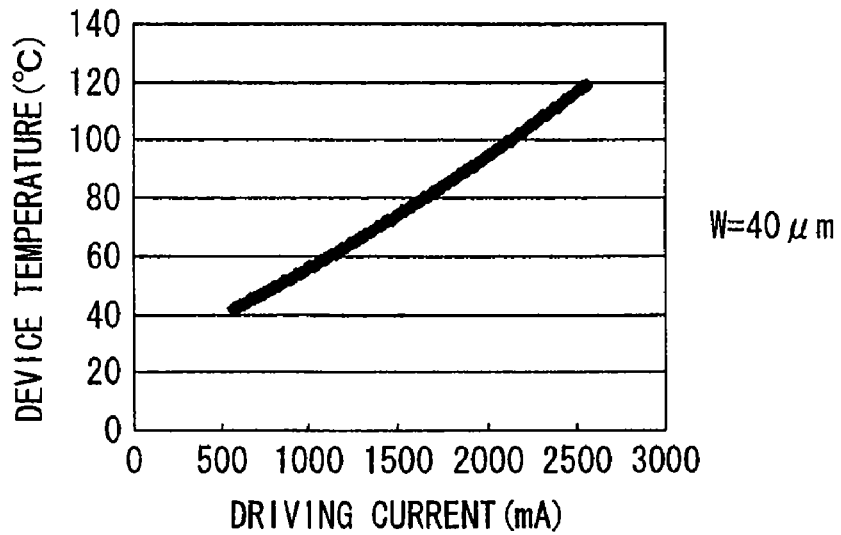
FIG. 7C  W=40 μm

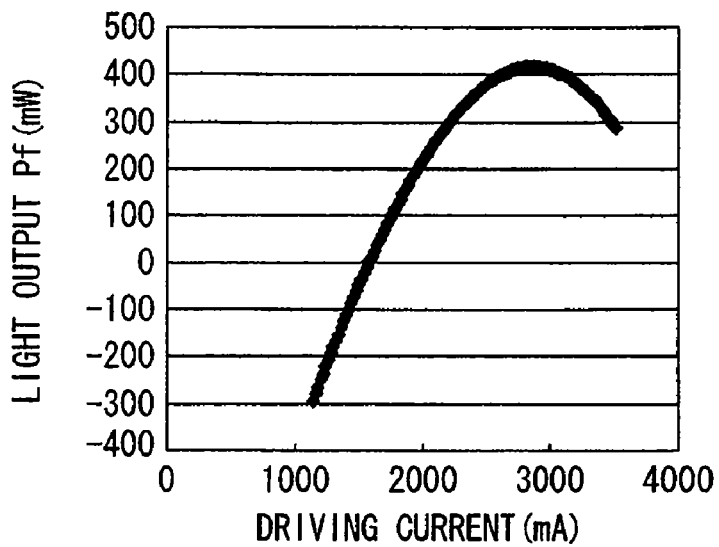
FIG. 8A    W=80 μm
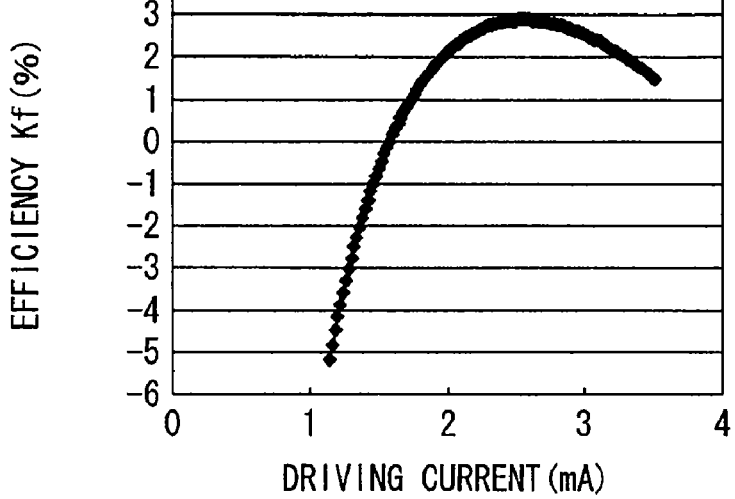
FIG. 8B    W=80 μm
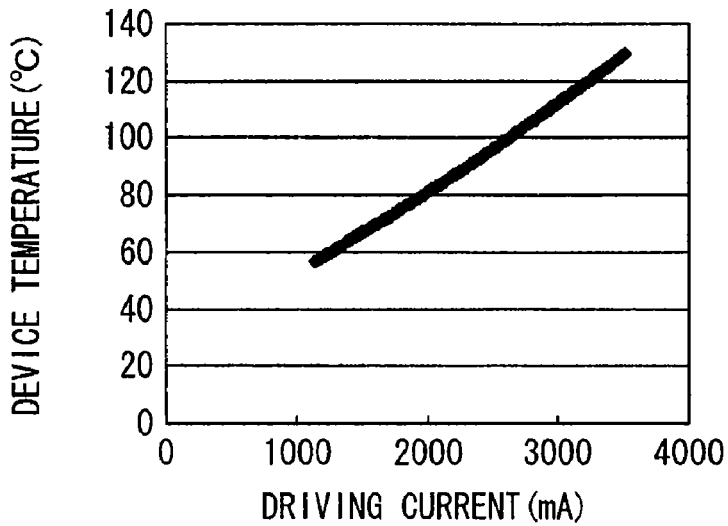
FIG. 8C    W=80 μm

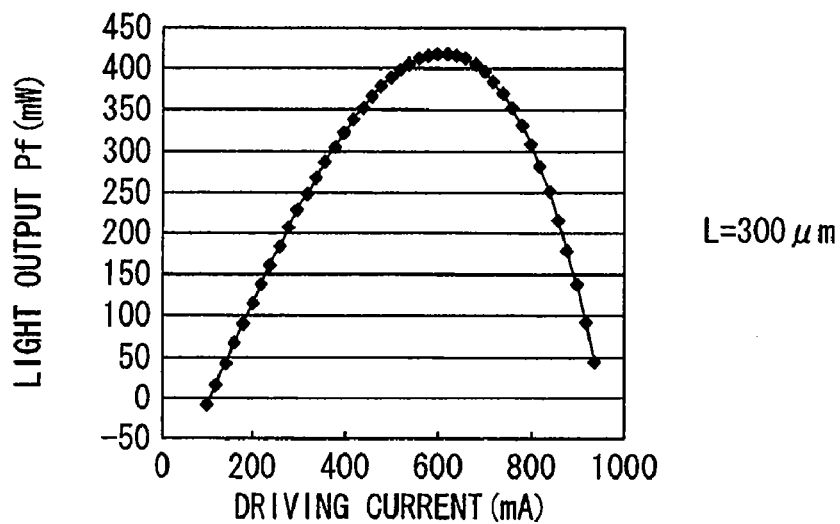
FIG. 10A  L=300 μm
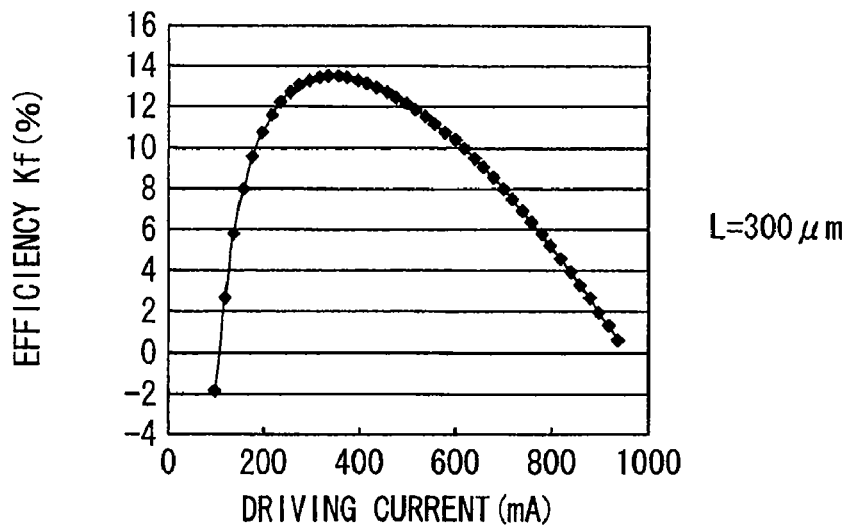
FIG. 10B  L=300 μm
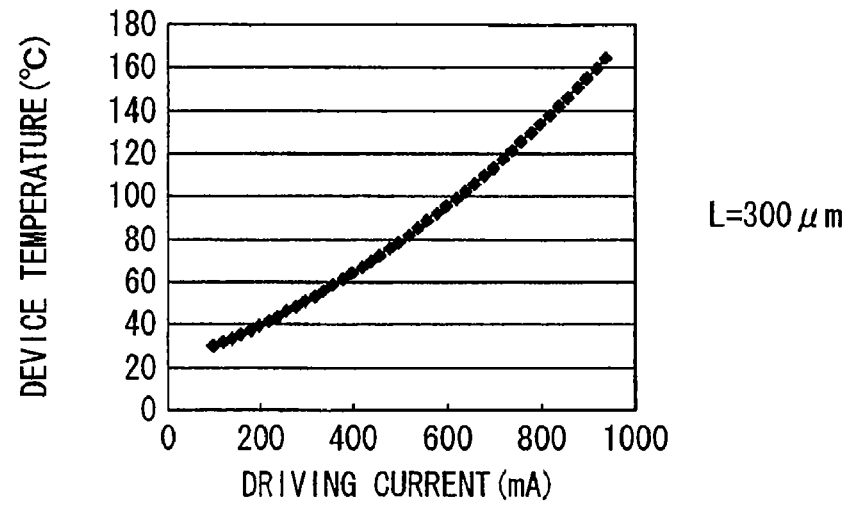
FIG. 10C  L=300 μm

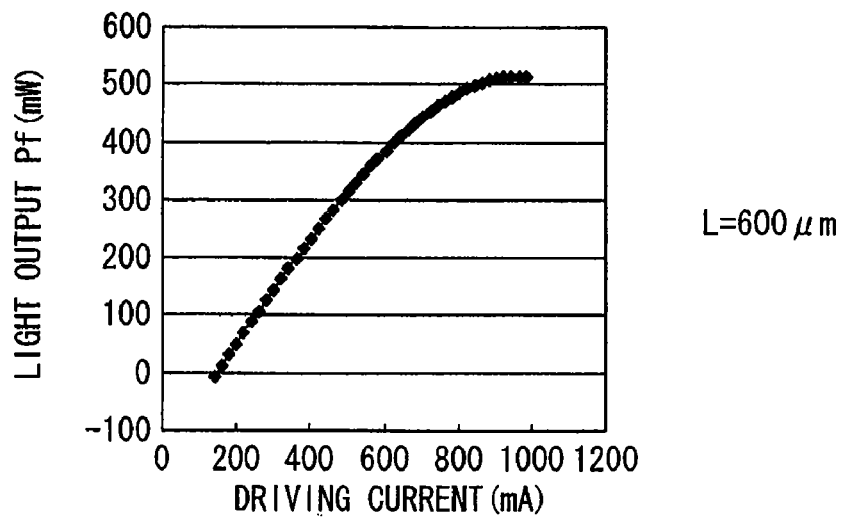
FIG. 11A    L=600 μm
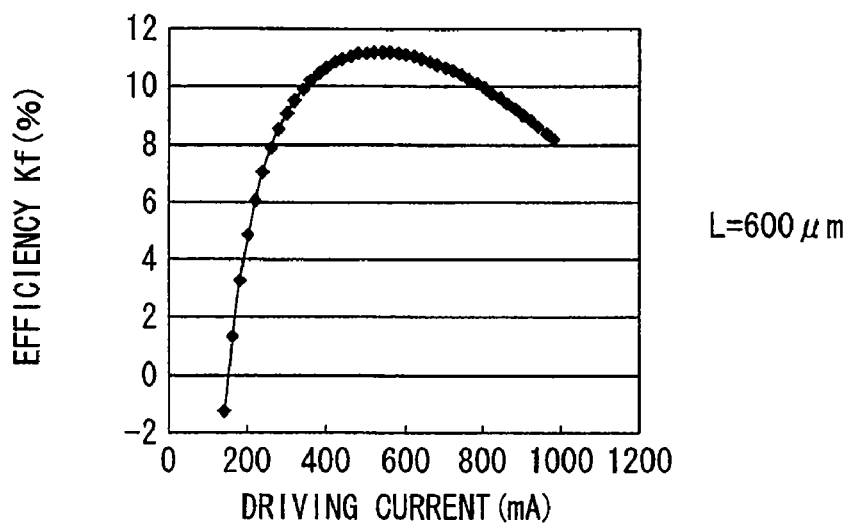
FIG. 11B    L=600 μm
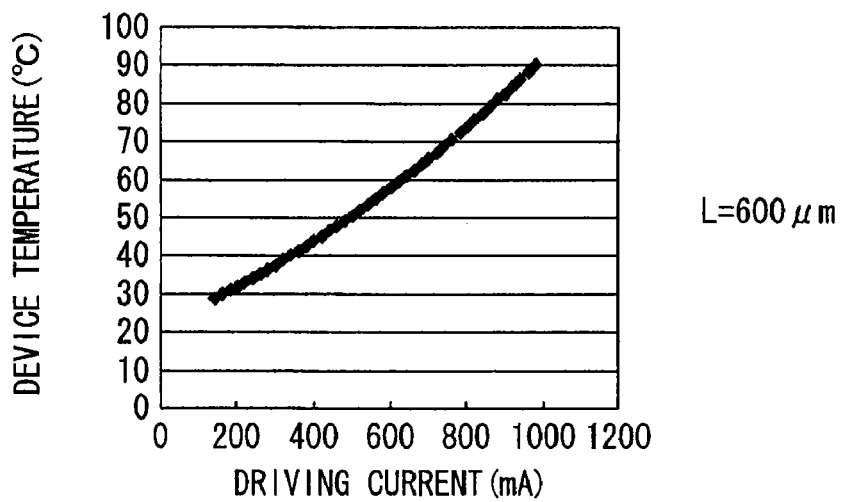
FIG. 11C    L=600 μm

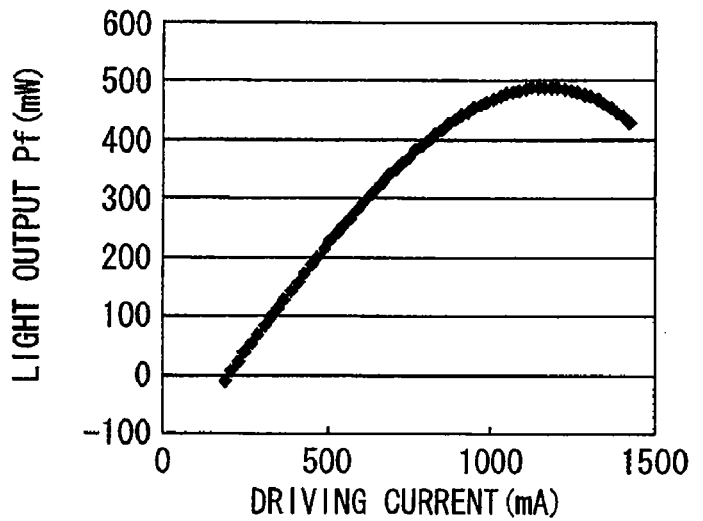
FIG. 12A  L=900 μm
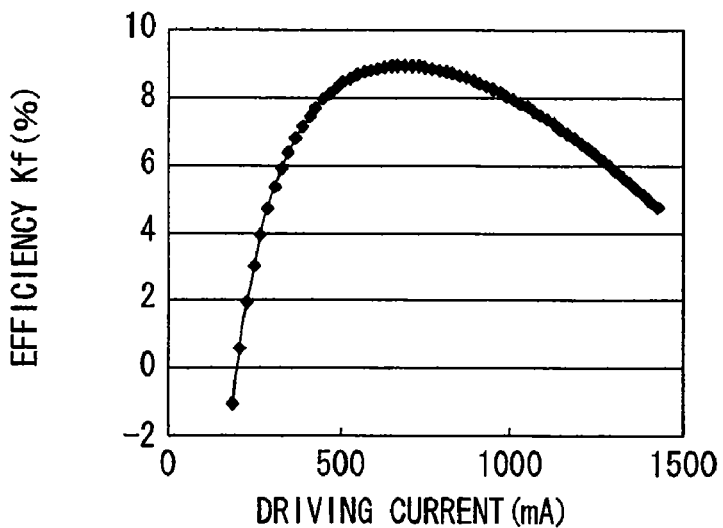
FIG. 12B  L=900 μm
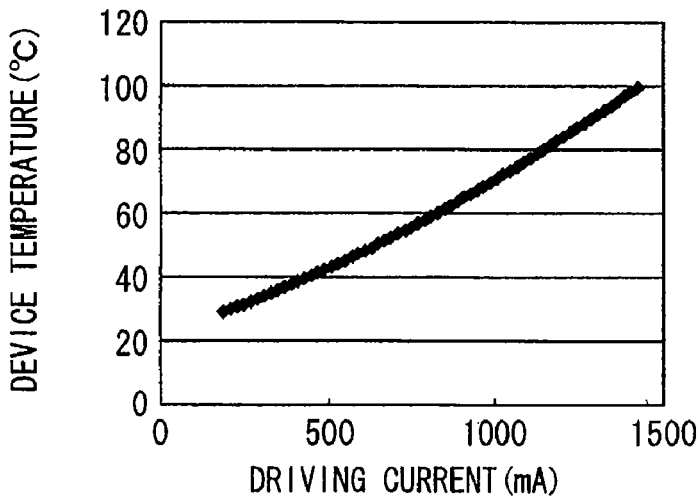
FIG. 12C  L=900 μm

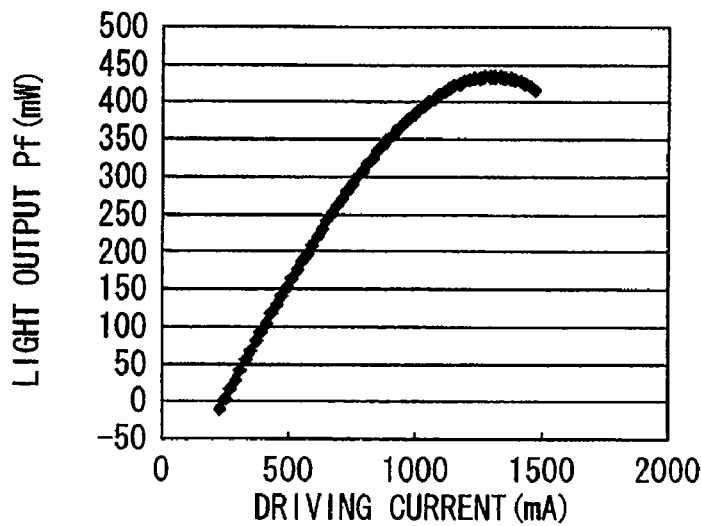
FIG. 13A  L=1200 μm
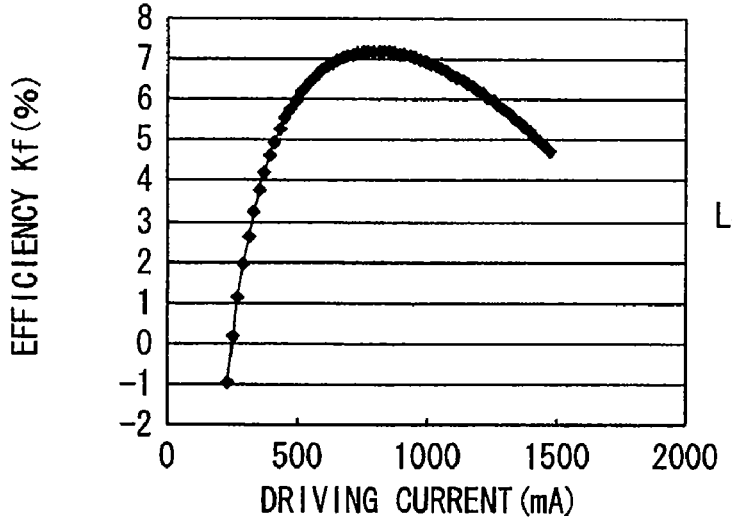
FIG. 13B  L=1200 μm
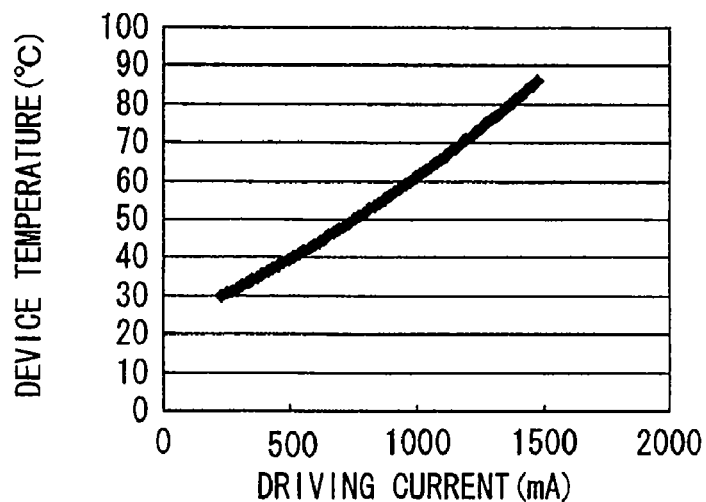
FIG. 13C  L=1200 μm

LASER DIODE DEVICE

CROSS REFERENCES TO RELATED APPLICATIONS

The present application claims priority to Japanese Patent Application JP 2004-369128 filed in the Japanese Patent Office on Dec. 21, 2004, the entire contents of which is being incorporated herein by reference.

BACKGROUND

The present invention relates to a laser diode device which includes semiconductor layers made of a nitride Group III-V compound semiconductor containing at least one of aluminum (Al), gallium (Ga), and indium (In) among Group 3B elements and nitrogen (N) among Group 5B elements (hereinafter referred to as "AlGaInN compound semiconductor"), and is capable of providing high output of 200 mW or more in the blue wavelength region.

It is considered that an AlGaInN compound semiconductor is the almost only material capable of providing emission in the range from 350 nm to 600 nm, and capable of realizing a high quality laser diode particularly in the blue wavelength range (from 400 nm to 500 nm). A narrow-stripe type high density optical disc laser realizing single transverse mode by using the AlGaInN material has been already in practical use, and has shown high reliability (for example, refer to Japanese Unexamined Patent Application Publication No. 2002-299765).

However, when attempt is made to realize a so-called broad area type laser in which the width of the light emitting region is widened in order to obtain higher output by the AlGaInN material, the guideline that the width of the light emitting region shall be more widened and the resonator length shall be lengthened for obtaining high output, which is effective when using the traditional AlGaAs material and the traditional AlGaInP material, is not effective. For example, in order to put a laser diode with 1 watt level to practical use, a structure in which the width of the light emitting region is about 50 μm and the resonator length is about 1000 μm is often utilized. However, when such a structure is applied to the AlGaInN material, the characteristics are significantly deteriorated, and it is difficult to obtain desired high output.

Therefore, in the past, a method to obtain high output by arraying a plurality of lasers with relatively narrowed width of the light emitting region has been used. Though the method is effective, there is a disadvantage that the method is not readily utilized because of complication of manufacturing steps, lowering of process yield, necessity of precise alignment with a micro lens array or the like in mounting and the like.

Blue laser diodes with high output are highly promising in the field such as microfabrication, display, and health care. Realization of high output blue lasers as stable as traditional infra-red laser diodes or red laser diodes has been strongly aspired. However, in the past, no effective guideline for obtaining blue laser diodes with high output, that is, blue laser diodes with broad area has been established.

SUMMARY

In view of such disadvantages, it is desirable to provide a laser diode device capable of obtaining high output with high light efficiency by using the AlGaInN compound semiconductor as a material.

According to an embodiment of the present invention, there is provided a laser diode device including a semiconductor layer which has an active layer and is made of a nitride Group III-V compound semiconductor containing at least one of aluminum (Al), gallium (Ga), and indium (In) among Group 3B elements and nitrogen (N) among Group 5B elements, in which the active layer has a strip-shaped light emitting region whose width W is from 5 μm to 30 μm, length L is from 300 μm to 800 μm, and output of laser light from the active layer is 200 mW or more. Here, "width" means a dimension in the direction perpendicular to both of the resonator direction and the lamination direction of the semiconductor layer. "Length" means a dimension in the resonator direction.

Output of laser light varies according to the feasible range of W and L of the foregoing light emitting region, (W, L) as follows:

a. The light emitting region (W, L) is in the region surrounded by 4 points of (5 μm, 300 μm), (5 μm, 800 μm), (15 μm, 400 μm) and (15 μm, 300 μm), and output is from 200 mW to less than 300 mW:

b. The light emitting region (W, L) is in the region surrounded by 5 points of (5 μm, 300 μm), (5 μm, 800 μm), (10 μm, 800 μm), (20 μm, 400 μm) and (20 μm, 300 μm), and output is from 300 mW to less than 400 mW:

c. The light emitting region (W, L) is in the region surrounded by 6 points of (5 μm, 600 μm), (5 μm, 800 μm), (10 μm, 800 μm), (30 μm, 400 μm), (20 μm, 300 μm) and (10 μm, 400 μm), and output is from 400 mW to less than 500 mW:

d. The light emitting region (W, L) is in the region surrounded by 4 points of (10 μm, 500 μm), (10 μm, 800 μm), (30 μm, 400 μm) and (20 μm, 400 μm), and output is from 500 mW to less than 700 mW:

e. The light emitting region (W, L) is in the region surrounded by 3 points of (20 μm, 400 μm), (20 μm, 550 μm) and (30 μm, 400 μm), and output is from 700 mW to less than 900 mW: and f. The light emitting region (W, L) is in the region surrounded by 3 points of (20 μm, 400 μm), (20 μm, 500 μm) and (30 μm, 400 μm), and output is 900 mW or more.

According to the laser diode device of the embodiment of the present invention, the width and the length of the light emitting region are set to the values in the optimal ranges. Therefore, high light efficiency can be obtained, and output can be improved. Therefore, it becomes possible to obtain high output close to 1 W at maximum by using the single laser diode device, and a high output blue laser smaller than in the device of the related art can be made. Further, if arrayed, it is possible to obtain over 10 W output. Furthermore, if stacked, it is possible to obtain 100 W or more output. In addition, efficiency and reliability can be improved, it is effective for lowering the driving current, and it is expected to decrease the manufacturing cost. When more suitable ranges of the width and the length of the light emitting region are selected from the foregoing optimal ranges according to output with desired power as in the foregoing a to f, higher effects can be obtained.

Additional features and advantages are described herein, and will be apparent from, the following Detailed Description and the figures.

BRIEF DESCRIPTION OF THE FIGURES

FIGS. 3A, 3B, and 3C are characteristics views showing simulation results in the case that a width W of a light emitting region of the laser diode device shown in FIG. 1 is 2 μm.

FIGS. 4A, 4B, and 4C are characteristics views showing simulation results in the case that W is 5 μm.

FIGS. 5A, 5B, and 5C are characteristics views showing simulation results in the case that W is 10 μm.

FIGS. 6A, 6B, and 6C are characteristics views showing simulation results in the case that W is 20 μm.

FIGS. 7A, 7B, and 7C are characteristics views showing simulation results in the case that W is 40 μm.

FIGS. 8A, 8B, and 8C are characteristics views showing simulation results in the case that W is 80 μm.

FIGS. 10A, 10B, and 10C are characteristics views showing simulation results in the case that a length L of the light emitting region of the laser diode device is 300 μm.

FIGS. 11A, 11B, and 11C are characteristics views showing simulation results in the case that L is 600 μm.

FIGS. 12A, 12B, and 12C are characteristics views showing simulation results in the case that L is 900 μm.

FIGS. 13A, 13B, and 13C are characteristics views showing simulation results in the case that L is 1200 μm.

DETAILED DESCRIPTION

Descriptions will be given of an embodiment of the present invention in detail with reference to the drawings.

Figure 1:
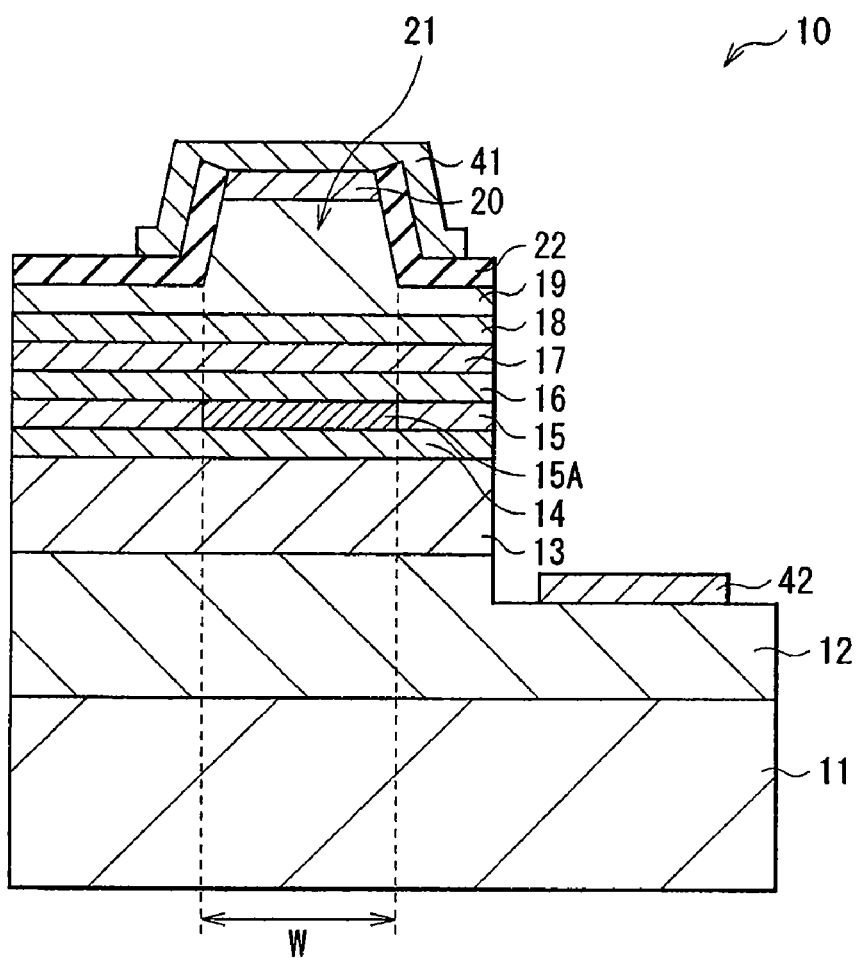
FIG. 1 is a cross section showing a structure of a laser diode device according to an embodiment of the present invention.
Figure 2:
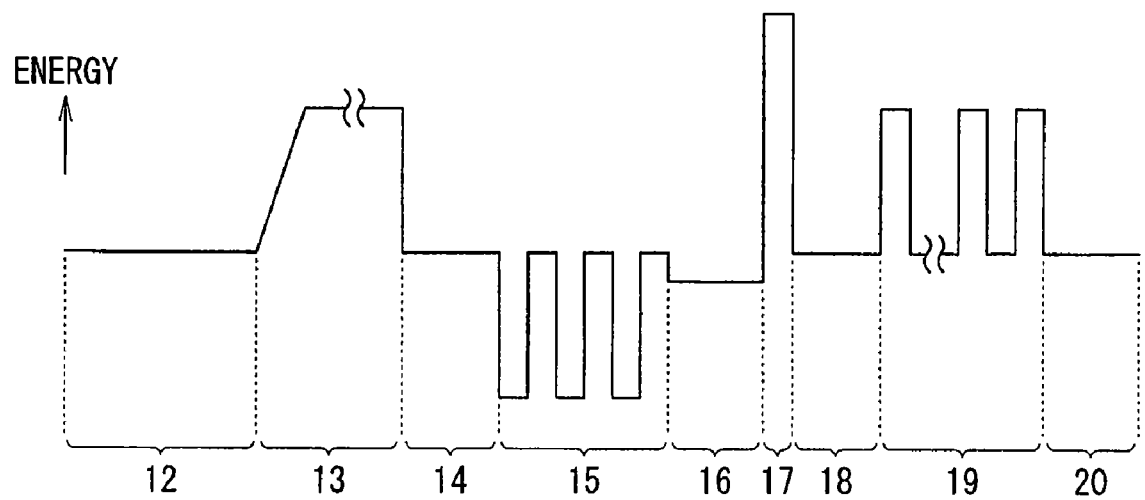
FIG. 2 is a view showing a model of energy levels of a valence band end of a band gap structure of the laser diode device shown in FIG. 1.

FIG. 1 shows a cross sectional structure of an example of a laser diode device, to which the present invention is applied. FIG. 2 shows a model of energy levels of the valence band end of the band gap structure of the laser diode device. In a laser diode device 10, for example, on a substrate 11, an n-side contact layer 12, an n-type cladding layer 13, a first guiding layer 14, an active layer 15, a second guiding layer 16, a carrier block layer 17, a third guiding layer 18, a p-type cladding layer 19, and a p-side contact layer 20 are layered sequentially. Of the foregoing, the p-type cladding layer 19 and the p-side contact layer 20 compose a strip-shaped (in FIG. 1, strip shape extending in the direction perpendicular to the paper plane) ridge 21. The ridge 21 limits a light emitting region 15A of the active layer 15. The portion of the active layer 15 corresponding to the ridge 21 is a strip-shaped light emitting region 15A.

The substrate 11 is made of, for example, sapphire being 80 μm thick in the lamination direction (hereinafter simply referred to as thickness). The n-side contact layer 12 and the like are formed on a face c of the substrate 11.

The n-side contact layer 12 is, for example, about from 4 μm to 5 μm thick, and is made of GaN. The n-type cladding layer 13 is, for example, 1.3 μm thick, and is made of an n-type $Al_{0.07}GaN_{0.93}$ mixed crystal doped with silicon as an n-type impurity. The first guiding layer 14 is, for example, 50 nm thick, and is made of n-type GaN doped with silicon as the n-type impurity.

The active layer 15 has, for example, a multiple quantum well structure in which a barrier layer made of GaN and a well layer made of a $Ga_{0.9}In_{0.1}N$ mixed crystal are alternately layered. The oscillation wavelength thereof is in the range from 400 nm to 500 nm. Further, in the active layer 15, it is preferable that the thickness per one well layer is about from 2 nm to 3.5 nm, and the number of the well layers is 2 or 3. When the number of the well layer is large, the threshold is increased and the output and efficiency are decreased. When the number of the well layer is small, resistance characteristics as a thin film becomes poor. Specifically, the active layer 15 is 30 nm thick, and has a multiple quantum well structure in which three pairs of the barrier layer being 7 nm thick, made of GaN and the well layer being 3 nm thick, made of the $Ga_{0.9}In_{0.1}N$ mixed crystal are layered.

The second guiding layer 16 also has a function to reduce crystal strain. The second guiding layer 16 is, for example, 50 nm thick, and is made of an InGaN mixed crystal. The carrier block layer 17 inhibits electron overflow. The carrier block layer 17 is, for example, 10 nm thick, and is made of an $Al_{0.17}GaN_{0.83}$ mixed crystal. The third guiding layer 18 is, for example, 50 nm thick, and is made of GaN. The p-type cladding layer 19 has a superlattice structure in which, for example, 100 pairs of an AlGaN mixed crystal layer being 2.5 nm thick, made of an $Al_{0.12}GaN_{0.88}$ mixed crystal doped with magnesium as the p-type impurity and a GaN layer being 2.5 nm thick, made of GaN doped with magnesium as the p-type impurity are alternately layered. The p-side contact layer 20 is, for example, 100 nm thick, and is made of p-type GaN doped with magnesium as the p-type impurity.

A p-side electrode 41 is provided on the p-side contact layer 20. The p-side electrode 41 has a structure in which, for example, palladium (Pd), platinum (Pt), and gold (Au) are layered sequentially from the p-side contact layer 20. Meanwhile, on the surface of the n-side contact layer 12, an n-side electrode 42 is formed. The n-side electrode 42 has a structure in which, for example, titanium (Ti), platinum (Pt), and gold (At) are sequentially layered. Regions other than the region where the p-side electrode 41 contacts with the p-side contact layer 20 are covered with an insulating film 22 made of silicon dioxide or the like.

Further, in the laser diode, reflector films (not shown) with different reflectance Rf and Rr are formed respectively on a pair of side faces opposed to each other in the longitudinal direction of the ridge 21, and resonator end faces are thereby composed. Thereby, light generated in the active layer 15 travels between the opposed reflector films, is amplified, and is emitted as a laser beam from the reflector film with low reflectance.

Descriptions have been given of the basic structure of the laser diode, to which the present invention is applied. In the present invention, the dimensions (width W and length L) of the light emitting region 15A in the active layer 15 are set to optimal values in order to obtain blue oscillation with high output. Specifically, the width W of the light emitting region 15A is set to the range from 5 μm to 30 μm, and the length L thereof is set to from 300 μm to 800 μm, and high output of 200 mW or more can be thereby obtained. Further, the output value is specifically determined by setting in detail the ranges of W and L based on the following simulation results. The results will be hereinafter described in detail.

FIGS. 3A to 8C show simulation results of light output Pf from a main emitting side end face, light efficiency Kf, and device temperature Tc in the case that the width W of the light emitting region was changed to 2 μm, 5 μm, 10 μm, 20 μm, 40 μm, and 80 μm. L was 600 μm.

Figure 9A:
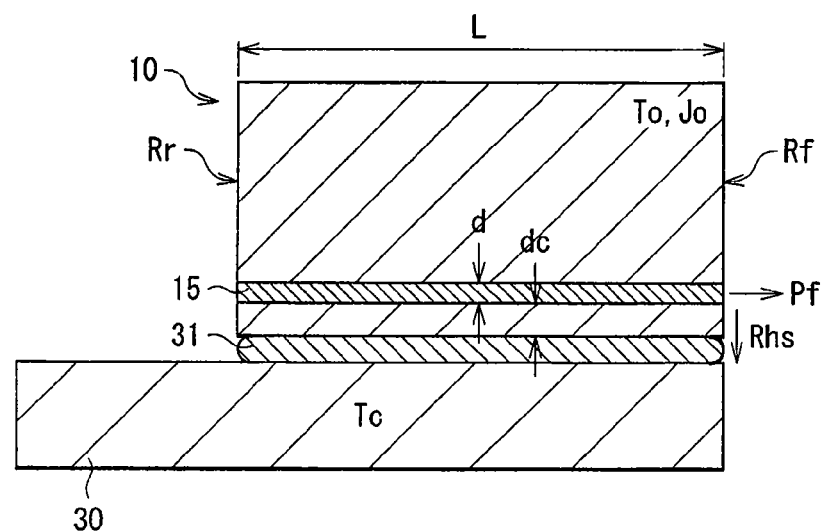
FIGS. 9A and 9B are a cross section and a top face view showing an example of a mounting structure of the laser diode device.
Figure 9B:
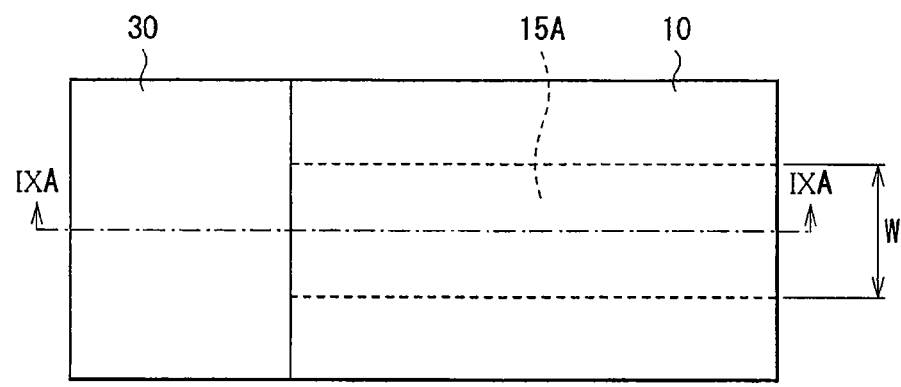

The simulation was performed on the assumption of the typical mounting structure in which the foregoing laser diode device 10 and a heat sink 30 were arranged with a solder layer 31 in between as shown in FIGS. 9A and 9B, and was performed by the following characteristics calculation methods using parameter values shown in Table 1. Then, the laser diode device 10 was mounted with the p-side contact layer 20 side opposed to the heat sink 30 (junction down mounting). Heat resistance Rt was in the range from 20 deg C./W to 30 deg C./W. Further, the p-type cladding layer 19 had a superlattice structure in which an AlGaN mixed crystal layer made of the $Al_{0.12}GaIn_{0.88}$ mixed crystal doped with magnesium as the p-type impurity and a GaN layer made of GaN doped with magnesium as the p-type impurity were alternately layered. The total thickness thereof was under 500 nm, and serial resistance Rs was in the range from 1 ohm to 2 ohm. As shown in Table 1, major features of the AlGaInN blue laser are that a clearing current density Jo is significantly high, and a voltage rise component Vg is large, which reaches several volts.

TABLE 1

| | |
|---|---|
| Active layer thickness d | 9 nm |
| Internal device efficiency ηi | 0.8 |
| Light confinement coefficient Γ | 0.023 |
| Gain factor β | $1 \times 10^{-2}$ cmμm/A |
| Waveguide loss $\alpha_i$ | $10$ cm$^{-1}$ |
| Main emitting side end face reflectance $R_f$ | 10% |
| Rear end face reflectance $R_r$ | 95% |
| Clearing current density $J_o$ | $2 \times 10^4$ A/cm$^2$ |
| Invalid current density $J_l$ | $5 \times 10^2$ A/cm$^2$ |
| Light emitting wavelength λ | 410 nm |

TABLE 1-continued

| | |
|---|---|
| Characteristics temperature $T_o$ | 150 K |
| Ambient temperature $T_s$ | 20 deg C. |
| Differential efficiency temperature coefficient $K_t$ | $6 \times 10^{-5}$ deg C.$^{-2}$ |
| Band gap of active layer $V_j$ | 2.76 V |
| Voltage rise component $V_g$ | 1.2 V |
| Spontaneous emission probability $\eta_a$ | 0.8 |
| Reabsorption probability $\eta_b$ | 0.5 |
| p-type cladding layer thickness $d_c$ | 0.5 μm |
| Serial resistance $R_s$ | 1-2 ohm |
| Heat sink heat resistance $R_{hs}$ | 10 deg C./W |
| Heat resistance $R_t$ | 20-30 deg C./W |
| Unit chip heat resistance $r_{th}$ | 120 deg C./W |

Calculation of the light output Pf, the light efficiency Kf, and the device temperature Tc was performed as follows:

(1) A threshold current Ith was calculated by Mathematical formula 1 and Mathematical formula 2. Internal quantum efficiency ηf was calculated by Mathematical formulas 3 to 5.

(2) A driving current Iop was obtained by Iop=Ith+ΔI (ΔI is freely selected). H was calculated by Mathematical formula 6.

(3) The temperature rise component was calculated by ΔT=Rt·H, and the device temperature Tc=ΔT+Ts was obtained.

(4) Ith (T) and ηf (T) were obtained by Mathematical formula 7 and Mathematical formula 8. Mathematical formulas 7 and 8 show influence on a threshold of temperature and differential efficiency.

(5) Pf was obtained by Mathematical formula 9.

(6) Kf was obtained by Mathematical formula 10.

Mathematical Formula 1

$$J_{th} = \frac{d_a}{\eta_i \Gamma \beta}\left\{\alpha_i + \frac{1}{2L}\ln\left(\frac{1}{R_f R_r}\right)\right\} + \frac{J_0 d_a}{\eta_i} + J_1$$

Mathematical Formula 2

$$I_{th} = J_{th} \cdot L \cdot W$$

Mathematical Formula 3

$$\eta_d = \frac{1.24\eta_i}{\lambda}\left(\frac{\alpha_m}{\alpha_i + \alpha_m}\right)$$

Mathematical Formula 4

$$\alpha_m = \frac{1}{2L}\ln\left(\frac{1}{R_f R_r}\right)$$

Mathematical Formula 5

$$\eta_f = \eta_d\left\{\frac{1}{1 + \sqrt{\frac{R_f}{R_r}\left(\frac{1-R_r}{1-R_f}\right)}}\right\}$$

Mathematical Formula 6

$$H = V_g \cdot I_{op} + R_s \cdot I_{op}^2 + (1-\eta_a)I_{th} \cdot V_j +$$
$$(1-\eta_j)(I_{op} - I_{th})V_j + \eta_a\eta_b I_{th} \cdot V_j$$

Mathematical Formula 7

$$I_{th}(T) = I_{th}(T_c)\exp\left\{\frac{T-T_c}{T_0}\right\}$$

Mathematical Formula 8

$\eta_f(T) = \eta_f(0°\text{ C.}) - k_i T^2$

Mathematical Formula 9

$P_f(T_c) = \eta_f(T)\{I_{op} - I_{th}(T)\}$

Mathematical Formula 10

$$K_f = \frac{P_f}{I_{op} \cdot V_{op}}$$

$V_{op} = V_j + V_g + I_{op} \cdot R_s$

The serial resistance value Rs was evaluated by using Mathematical formula 11. The heat resistance was evaluated by using Mathematical formula 12. Mathematical formulas 11 and 12 are empirical equations.

Mathematical Formula 11

$$R_s = 0.8 + \frac{3}{\sqrt{W}}$$

Mathematical Formula 12

$$R_t = R_{hs} + \frac{r_{th} \times d_c}{\left(\frac{L}{100}\right)\left(\frac{W}{10}\right)^{0.7}}$$

In Mathematical formula 12, Rhs represents heat resistance of the heat sink 30, and rth represents unit chip heat resistance per W=10 μm, L=100 μm, and dc=1 μm.

The heat resistance Rhs of the heat sink 30 is a value determined by the material of the heat sink 30.

As evidenced by FIG. 3A to FIG. 8C, in the case of a so-called narrow stripe device with W=2 μm, the output is 200 mW at maximum. However, when W is increased to 5 μm, 10 μm, the maximum output is accordingly increased to 350 mW, 500 mW. However, when W is doubled from 20 μm to 40 μm, growth of the maximum output becomes dull, while the driving current Iop for providing the maximum output is rapidly increased, and efficiency is deteriorated down to 8% or less. Such efficiency deterioration is not shown in the AlGaAs infra-red laser (about 50%) and the AlGaInP red laser (about 20%), and may be the issue specific to the blue laser. Further, the device temperature then is over 80 deg C., which means highly reliable operation may be hard to be obtained. That is, it is found that by setting W to the range from 5 μm to 30 μm, favorable characteristics can be obtained for the light output, the efficiency, and the device temperature.

FIGS. 10A to 13C show simulation results of the light output Pf, the efficiency Kf, and the device temperature Tc under the conditions similar to of FIGS. 3A to 4C in the case that the length L was changed to 300 μm, 600 μm, 900 μm, and 1200 μm. W was 10 μm. As evidenced by FIGS. 10A to 13C, when L is lengthened, the output is not much increased, but the efficiency is rapidly deteriorated. Again, in this regard, the blue laser is different from the infra-red laser and the red laser, in which when L is lengthened, the output is increased pro rata.

Figure 14:
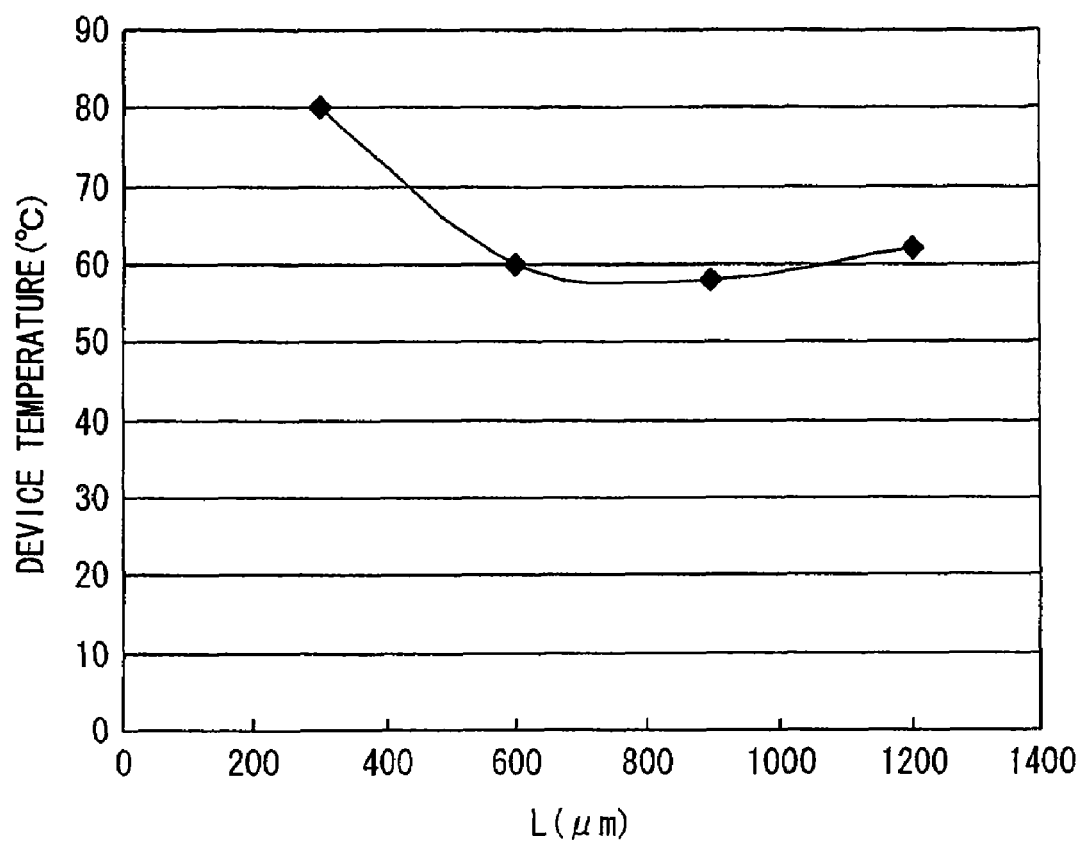
FIG. 14 is a characteristics view showing L dependence of device temperatures when driven at 400 mW based on FIGS. 10A to 13C.

FIG. 14 shows L dependence of device temperatures when driven at 400 mW based on FIGS. 10A to 13C. In the traditional red laser or the like, the longer L is, the more the device temperature can be rapidly lowered. However, in the blue laser, as evidenced by FIG. 14, when L is lengthened, the device temperature is lowered a little, and then increased again.

That is, it is found that by setting L to the range from 300 μm to 800 μm, favorable characteristics can be obtained for the light output, the efficiency, and the device temperature.

As above, the AlGaInN blue laser has characteristics that the clearing current density Jo is high, and the voltage rise component Vg is large (refer to Table 1). These characteristics cause the differences from the traditional AlGaAs infra-red laser and the traditional AlGaInP red laser. Therefore, increasing the volume of the active layer 15 leads to increasing the threshold. In the result, it is difficult to simply apply the design guideline to obtain high output by increasing W and L, which is a traditional usual practice, and it is important to find appropriate values of (W, L) by balancing a plurality of factors such as light output and efficiency. Therefore, descriptions will be hereinafter given of more detailed setting ranges of appropriate values of (W, L).

Figure 15A:
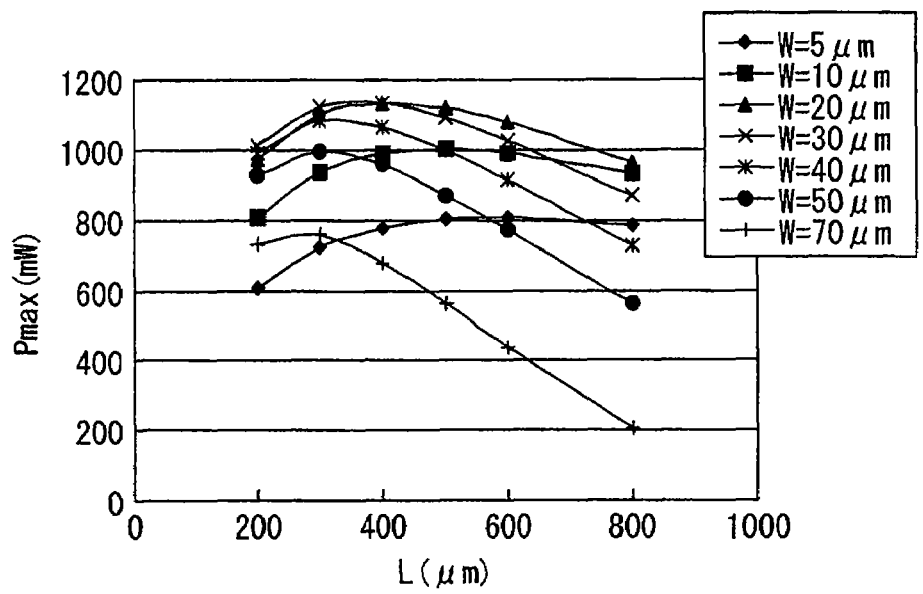
FIG. 15A is a view showing L dependence of the obtainable maximum output Pmax based on the results of FIGS. 3A to 14 using W as a parameter.
Figure 15B:
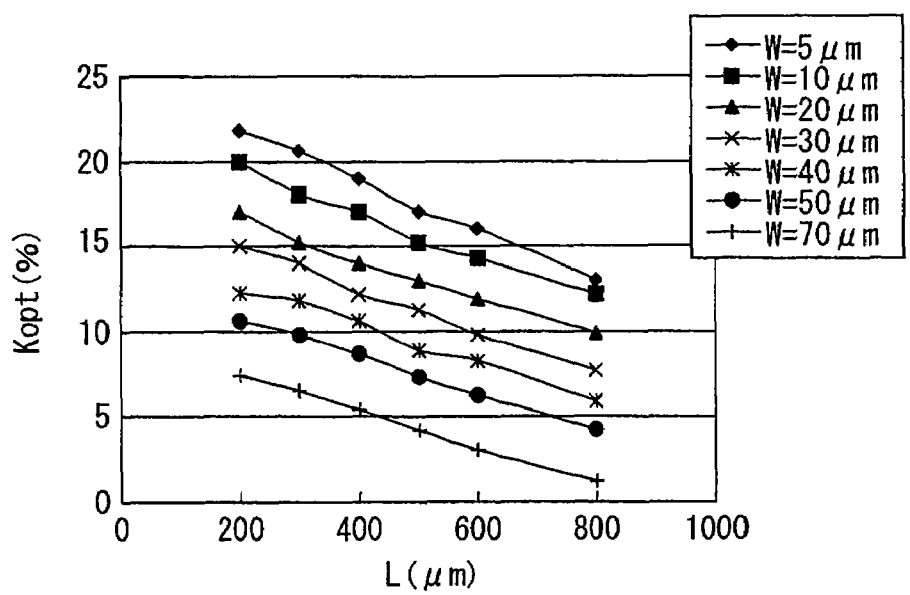
FIG. 15B is a view showing L dependence of efficiency at such maximum output Pmax using W as a parameter.

FIG. 15A shows L dependence of an obtainable maximum output Pmax based on the results of FIGS. 3A to 14, and FIG. 15B shows L dependence of efficiency at the maximum output Pmax. W is used as a parameter for these figures. As shown in FIG. 15A, when L is increased, the obtainable maximum output Pmax tends to be decreased, and the wider W is, the more intense such a tendency becomes. Further, in the case of the same L, when W exceeds 20 μm, the maximum output Pmax is dropped, while when W is in the range of 20 μm or less, the wider W is, the larger the maximum output Pmax becomes. However, in view of efficiency, as evidence by FIG. 15B, the smaller W and L are, the better the efficiency is. Therefore, it is not always preferable to set W to about 20 μm in order to obtain high efficiency and high output.

Figure 16A:
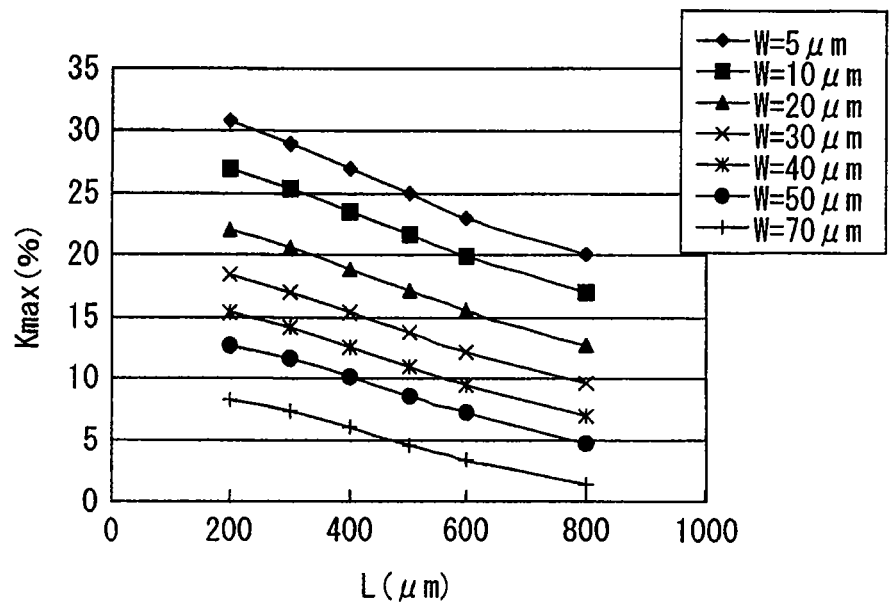
FIG. 16A is a view showing L dependence of the obtainable maximum efficiency Kmax.
Figure 16B:
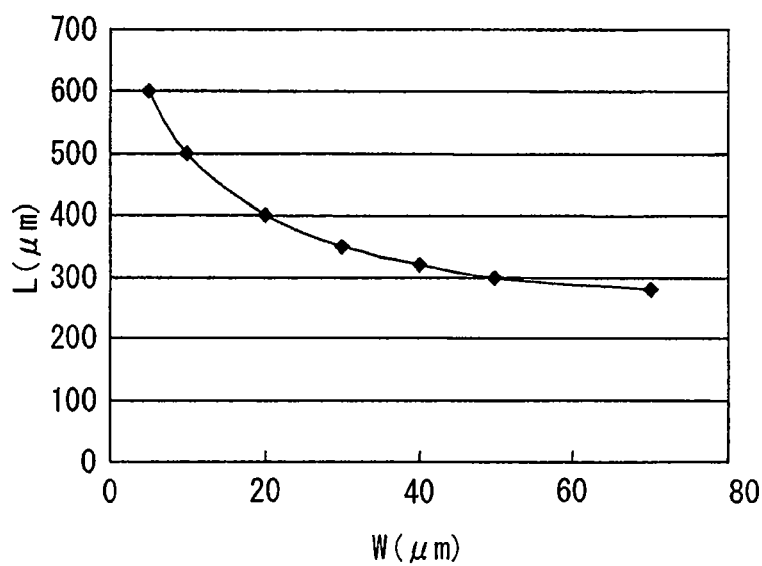
FIG. 16B is a view showing optimal values of L relative to W for obtaining the maximum output Pmax.
Figure 17A:
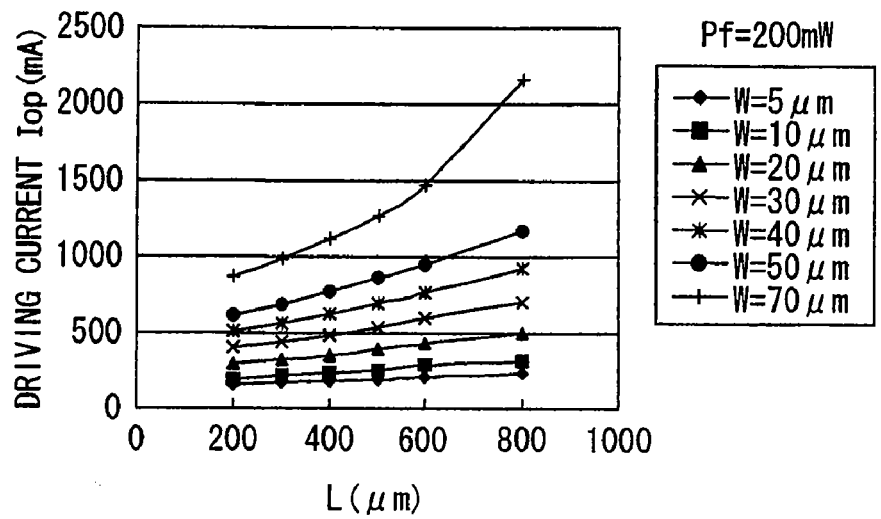
FIGS. 17A, 17B, and 17C are views showing L dependence of a driving current Iop, efficiency, and device temperatures when output is 200 mW by using W as a parameter.
Figure 17B:
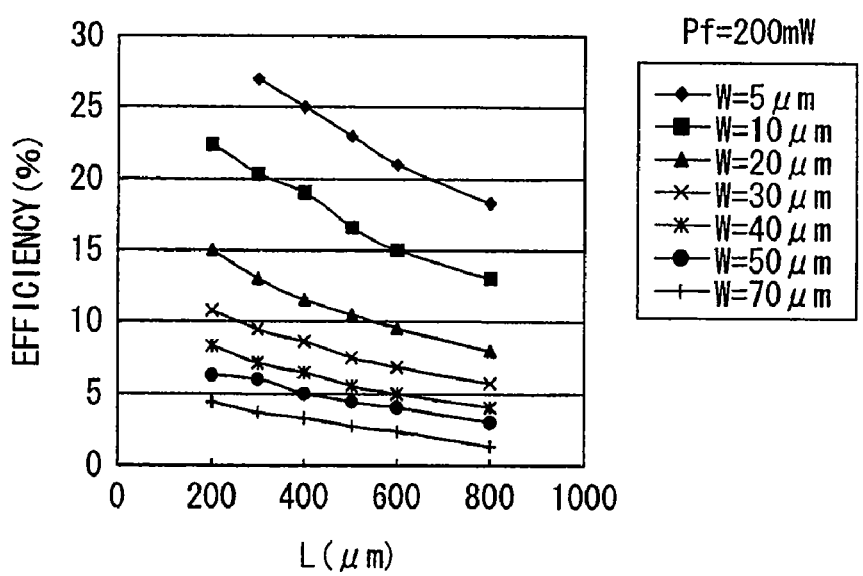
Figure 17C:
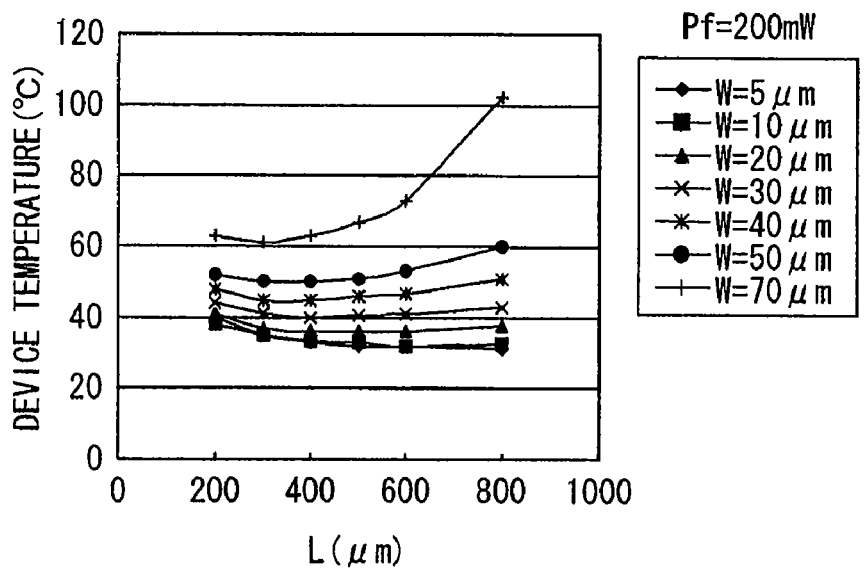
Figure 18A:
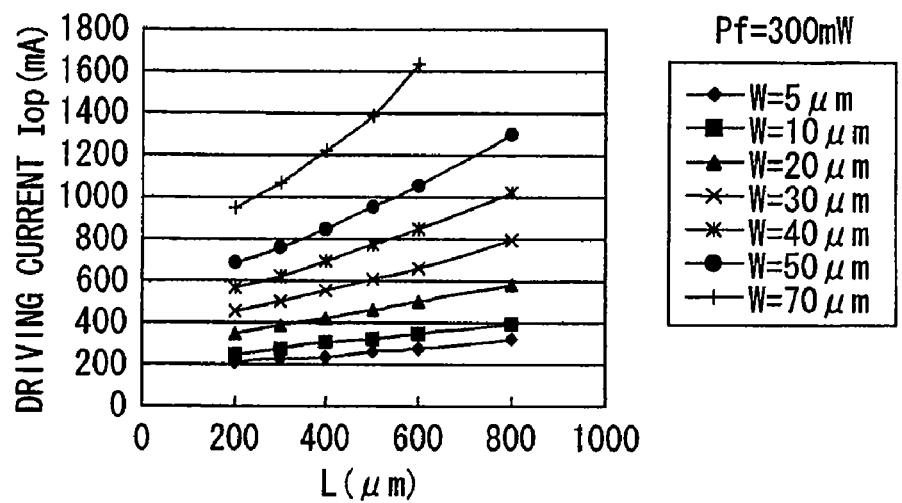
FIGS. 18A, 18B, and 18C are views showing L dependence of the driving current Iop, the efficiency, and the device temperatures when output is 300 mW by using W as a parameter.
Figure 18B:
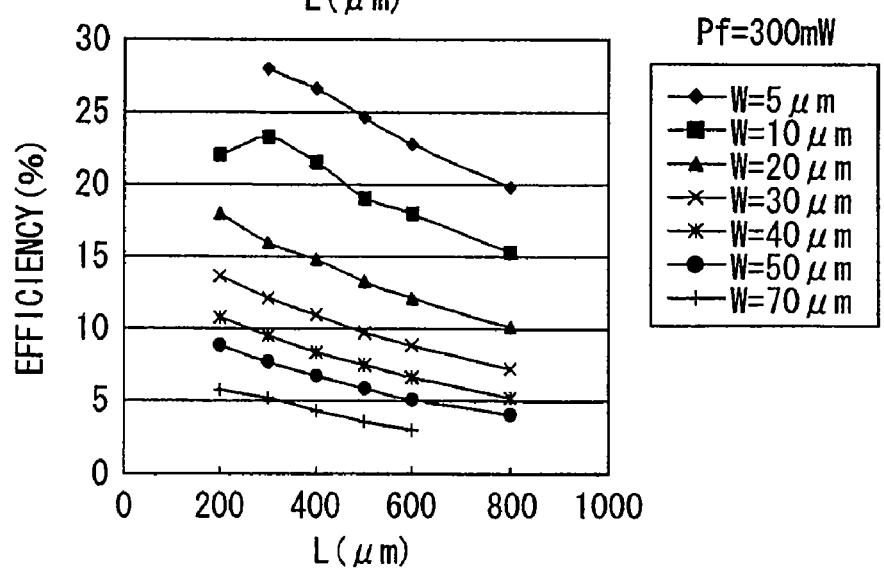
Figure 18C:
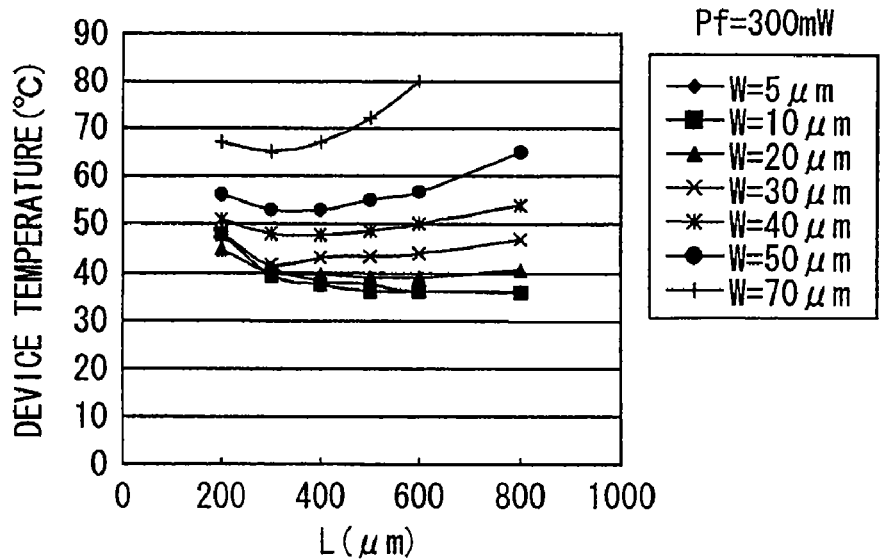
Figure 19A:
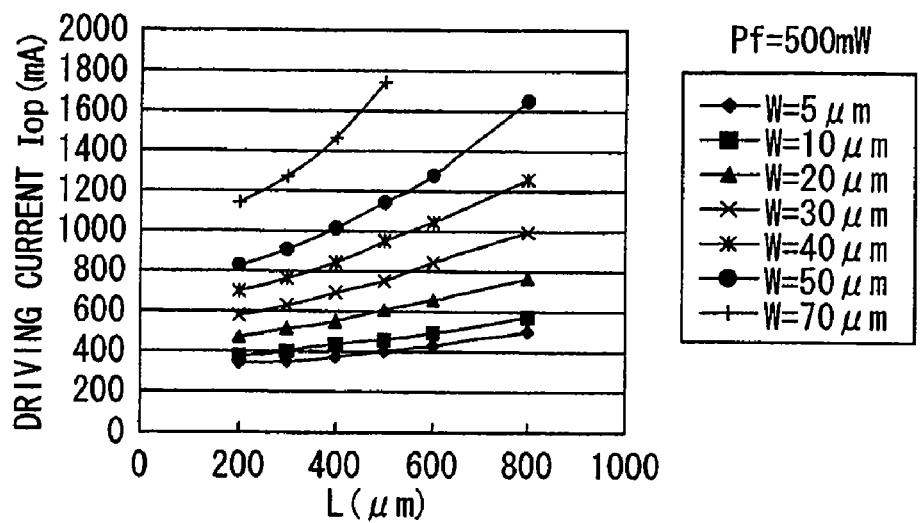
FIGS. 19A, 19B, and 19C are views showing L dependence of the driving current Iop, the efficiency, and the device temperatures when output is 500 mW by using W as a parameter.
Figure 19B:
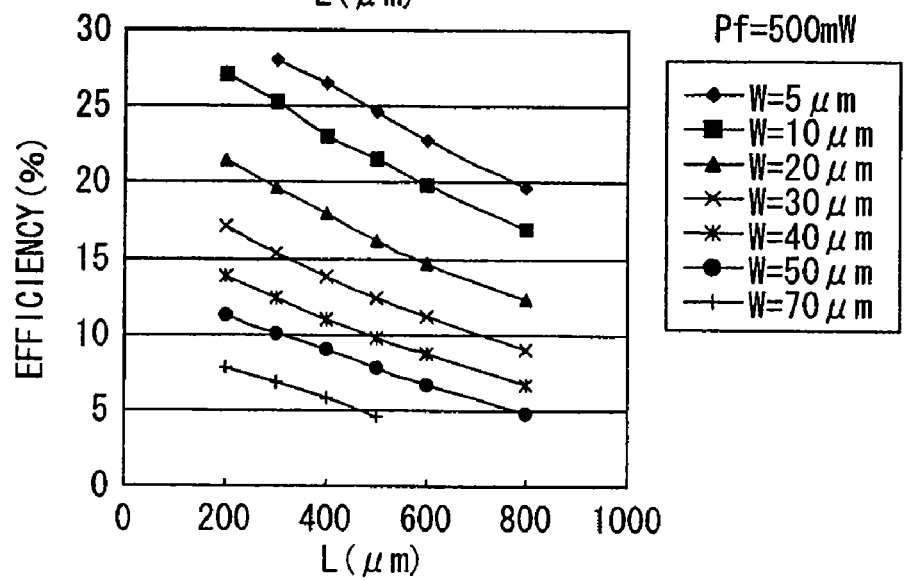
Figure 19C:
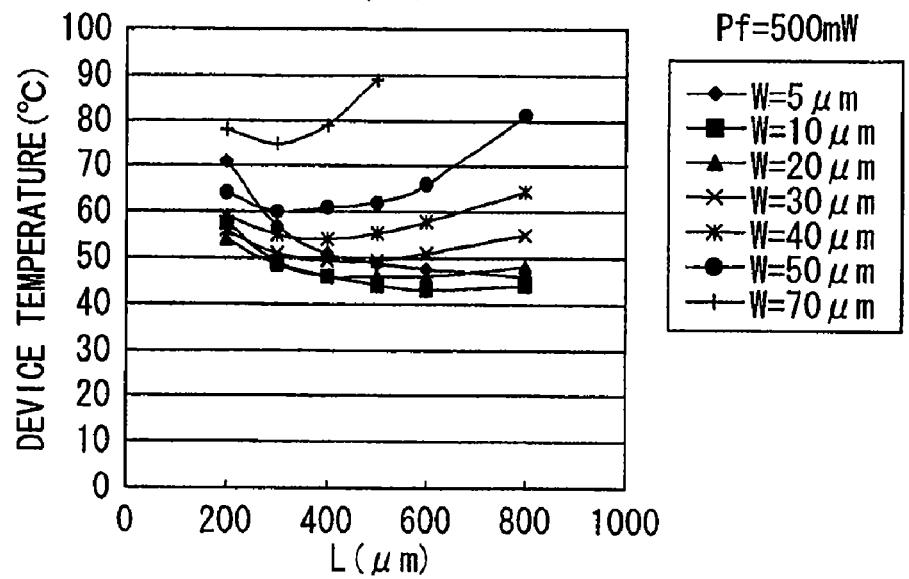
Figure 20A:
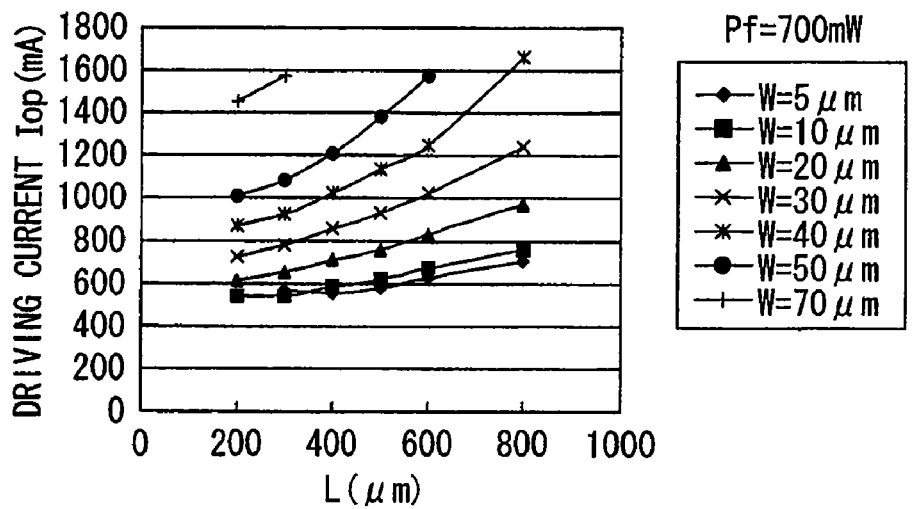
FIGS. 20A, 20B, and 20C are views showing L dependence of the driving current Iop, the efficiency, and the device temperatures when output is 700 mW by using W as a parameter.
Figure 20B:
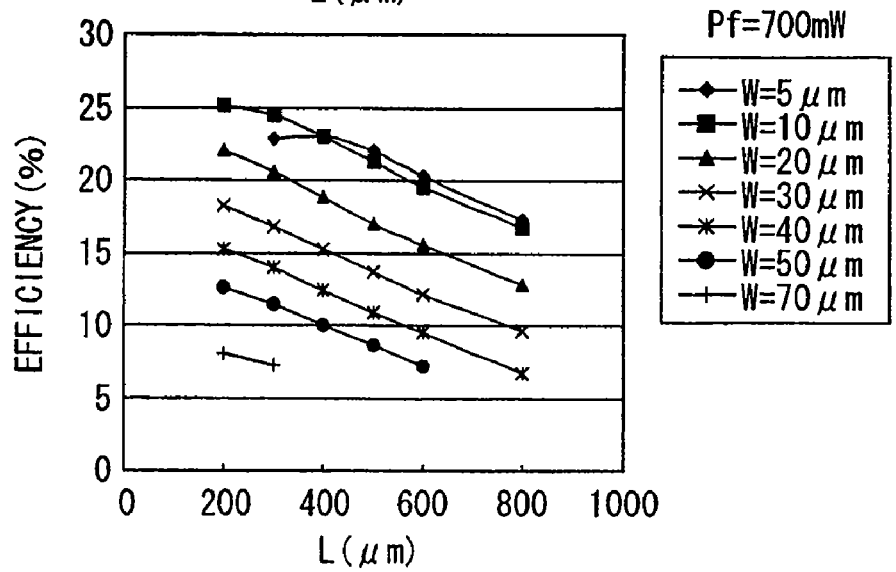
Figure 20C:
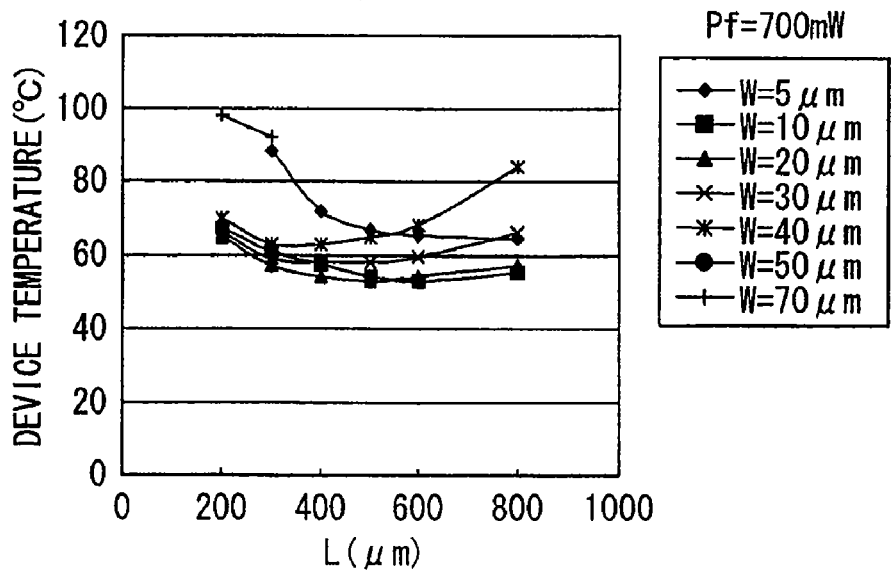
Figure 21A:
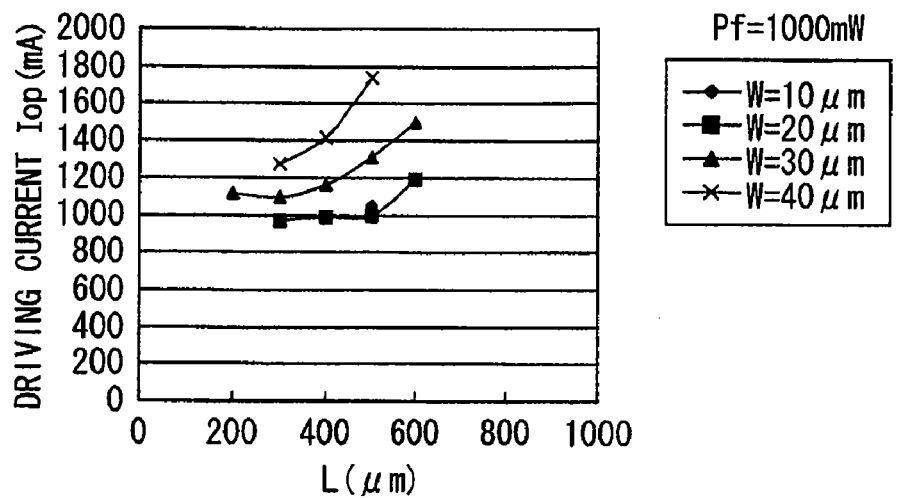
FIGS. 21A, 21B, and 21C are views showing L dependence of the driving current Iop, the efficiency, and the device temperatures when output is 1000 mW by using W as a parameter.
Figure 21B:
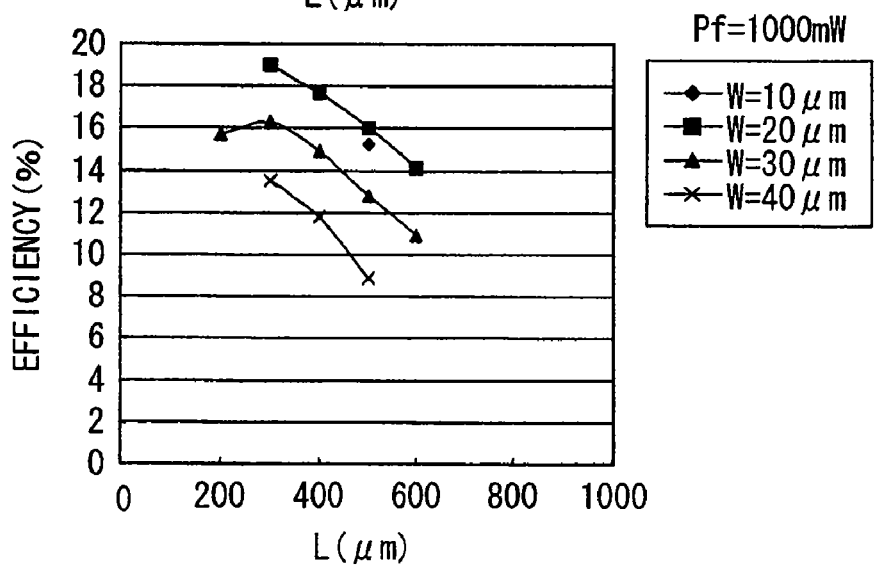
Figure 21C:
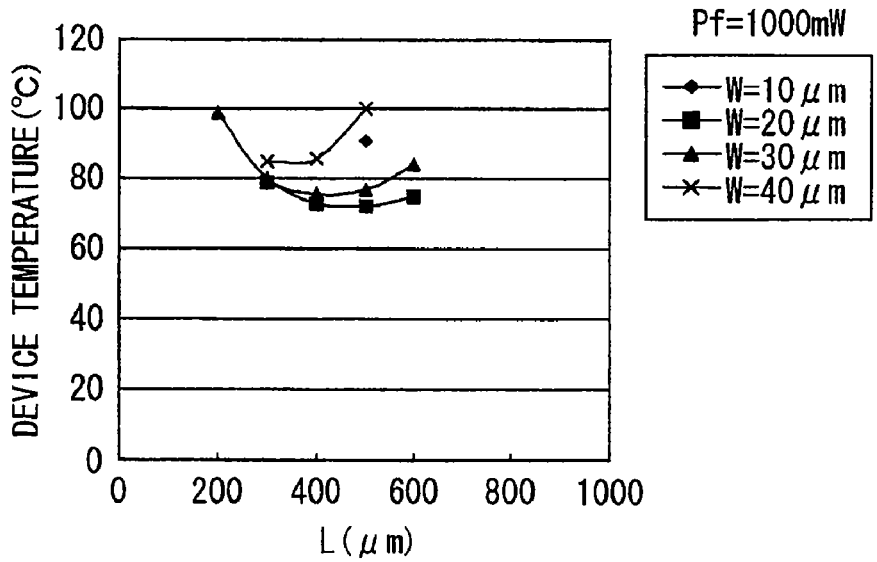

FIG. 16A shows L dependence of an obtainable maximum efficiency Kmax, and FIG. 16B shows optimal values of L relative to W for obtaining the maximum output Pmax, respectively. As evidenced by FIG. 16A and FIG. 16B, the maximum efficiency Kmax is generally obtained at output lower than in efficiency at the maximum output Pmax, and the value thereof is higher by about several %. Further, as shown in FIG. 16B, regarding the appropriate value of (W, L) for obtaining the maximum output Pmax, there is a tendency that the wider W is, the shorter L is. Further, it is found that L is rather shorter compared to in the traditional so-called broad area type laser diode.

FIGS. 17A to 21C show L dependence of the driving current Iop, the efficiency, and the device temperatures in the case that the output was 200 mW, 300 mW, 500 mW, 700 mW, and 1000 mW by using W as a parameter. As shown in FIGS. 17A to 21C, when L is increased, Iop is increased quadratic functionally. This may be caused by multiplier effect of the fact that increased waveguide loss raises the threshold linear functionally and differential efficiency is decreased. The wider W is or the larger the output is, the higher the increase ratio is. Further, correspondingly thereto, the higher the Iop is, the lower the efficiency becomes. As shown in FIGS. 15A to 16B, the larger W and L become, the lower the efficiency becomes. Therefore, if only desiring to increase the efficiency, it is advantageous that (W, L) is lessened as much as possible in the practical range. Further, for the device temperature, low temperatures are obtained when W is narrow and L is longer in low output. However, favorable device temperatures can be obtained by slightly widening W in high output. Since the device temperature is largely influenced by heat generation and exhaust heat, it is difficult to determine the device temperature only by how much low Iop is or the efficiency.

Figure 22:
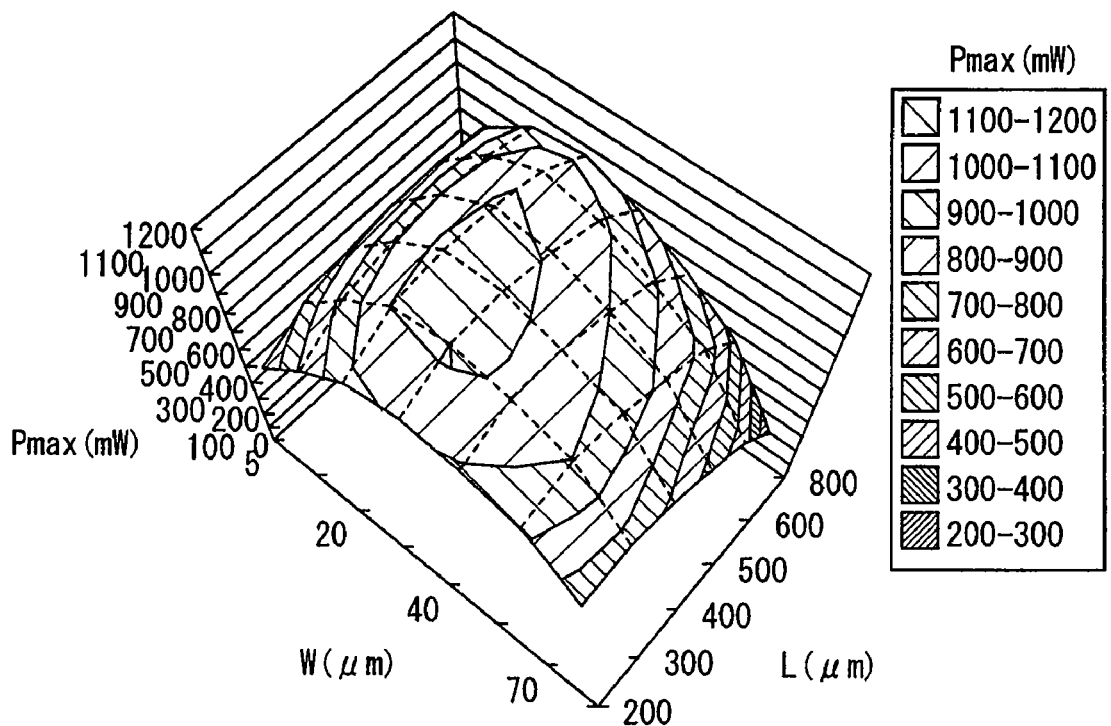
FIG. 22 is a view showing the maximum output Pmax relative to (W, L) in contour.
Figure 23:
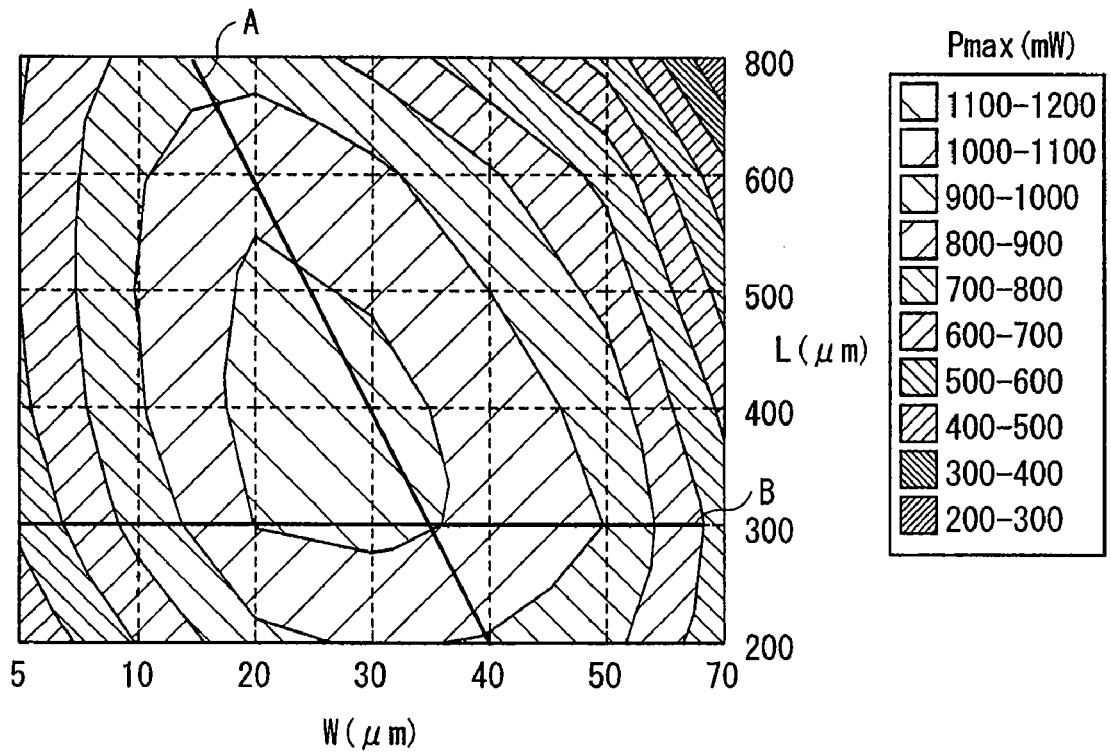
FIG. 23 is a view showing FIG. 22 two-dimensionally.

FIG. 22 shows the maximum output Pmax relative to (W, L) in contour. FIG. 23 shows FIG. 22 two-dimensionally. The cross section of FIG. 22 in the case of W=5 µm, 10 µm, 20 µm, 30 µm, 40 µm, 50 µm, and 70 µm corresponds to the foregoing FIG. 15A. As evidenced by FIG. 22 and FIG. 23, if the efficiency is ignored, the maximum output Pmax is obtained in the case of W=about from 20 µm to 30 µm and L=about 350 µm to 450 µm. In this case, Pmax is about 1.1 W. Meanwhile, as described above, since the efficiency is higher when both W and L are smaller, the efficiency is more favorable in the lower left of the coordinates. Therefore, the region on the upper right side over border line A of FIG. 23 is almost meaningless. Further, when taking account of the device temperature, the higher the device temperature is, the more deteriorated reliability becomes. Therefore, the region lower than L=300 µm, border line B is not preferable. From the foregoing, it is found that generally when (W, L) is in the region on the lower left side under the border line A and on the upper side over the border line B, both the maximum output Pmax and the efficiency can be improved.

FIG. 24 to FIG. 29 respectively show feasible ranges of W and L, (W, L) in the case that the output is from 200 mW to less than 300 mW, from 300 mW to less than 400 mW, from 400 mW to less than 500 mW, from 500 mW to less than 700 mW, from 700 mW to less than 900 mW, and 900 mW or more. (W, L) is preferably in the region to meet Pmax>P0+ 200 mW in FIG. 23 where light output to be desirably obtained from the laser diode device 10 is P0.

Further, (W, L) more preferably meets the following conditions A and B.

A: L is in the range where temperature difference with the minimum temperature relative to W in FIGS. 17A to 21C is within 5 deg C.

B: The efficiency is 15% or more.

The wider W is, the higher and the more favorable the COD (Catastrophic Optical Damage) level not shown in the foregoing calculation result is. Therefore, in consideration of the COD level, (W, L) not satisfying A or B can be selected.

Figure 24:
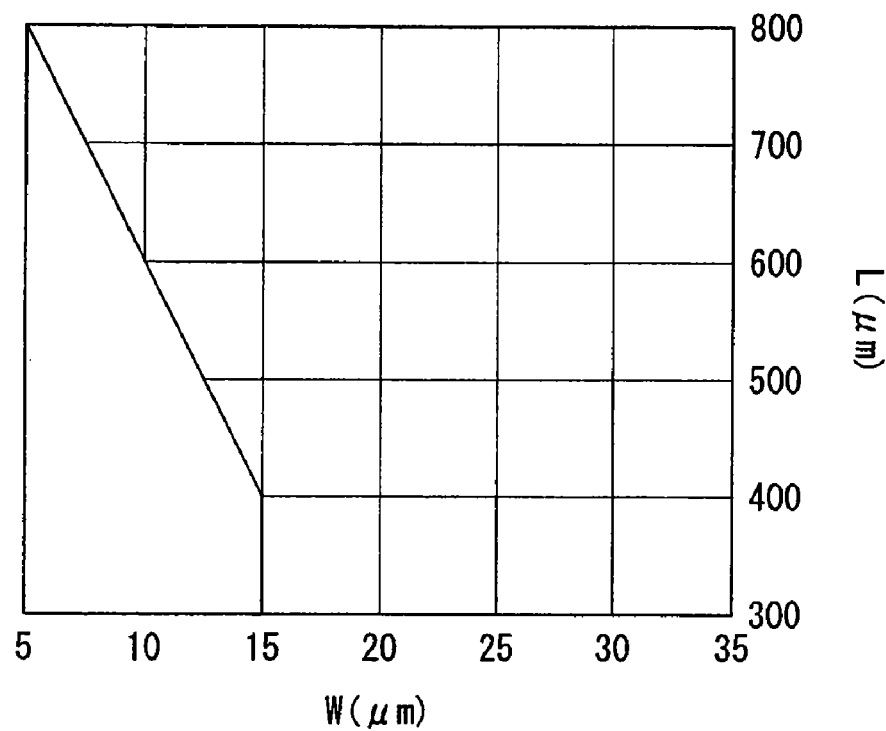
FIG. 24 is a view showing a feasible range of W and L, (W, L) in the case that the output is from 200 mW to less than 300 mW.

Specifically, in the case that the output is from 200 mW to less than 300 mW, as shown in FIG. 24, (W, L) is in the region surrounded by 4 points of (5 µm, 300 µm), (5 µm, 800 µm), (15 µm, 400 µm), and (15 µm, 300 µm).

Figure 25:
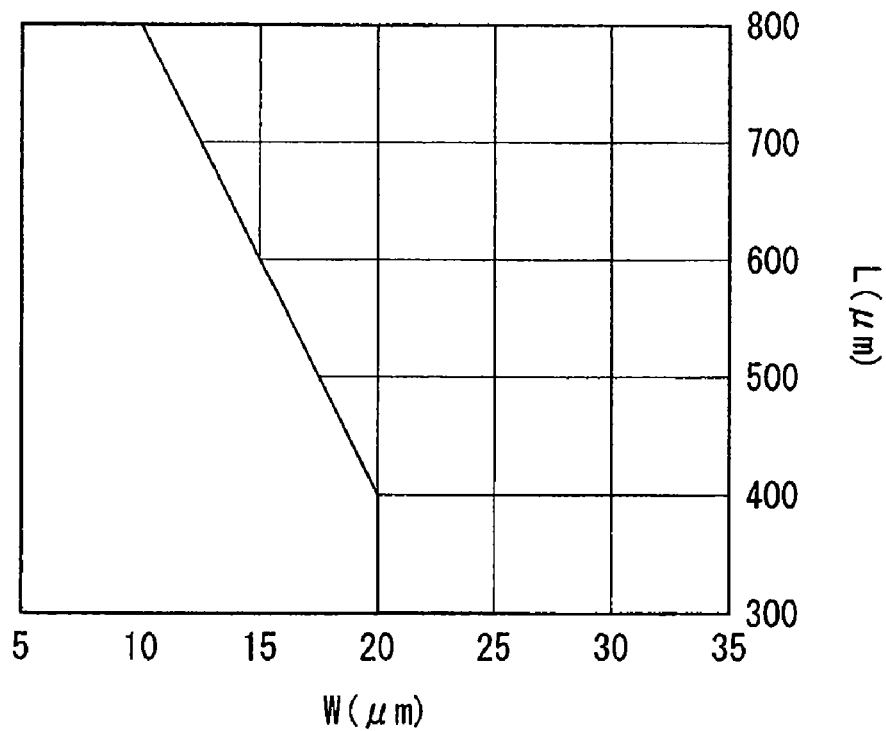
FIG. 25 is a view showing a feasible range of W and L, (W, L) in the case that the output is from 300 mW to less than 400 mW.

In the case that the output is from 300 mW to less than 400 mW, as shown in FIG. 25, (W, L) is in the region surrounded by 5 points of (5 µm, 300 µm), (5 µm, 800 µm), (10 µm, 800 µm), (20 µm, 400 µm), and (20 µm, 300 µm).

Figure 26:
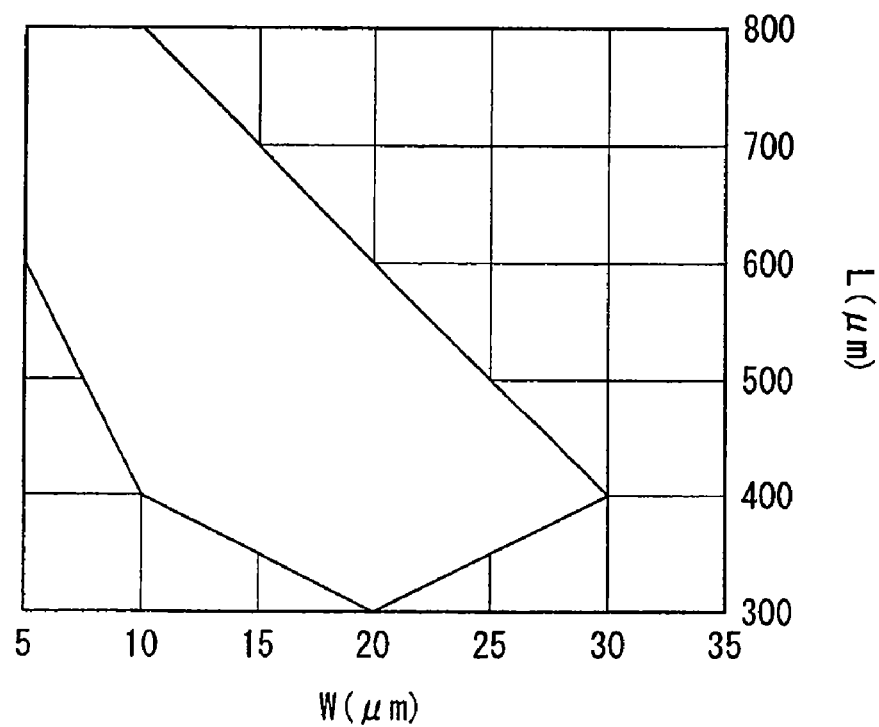
FIG. 26 is a view showing a feasible range of W and L, (W, L) in the case that the output is from 400 mW to less than 500 mW.

In the case that the output is from 400 mW to less than 500 mW, as shown in FIG. 26, (W, L) is in the region surrounded by 6 points of (5 µm, 600 µm), (5 µm, 800 µm), (10 µm, 800 µm), (30 µm, 400 µm), (20 µm, 300 µm), and (10 µm, 400 µm).

Figure 27:
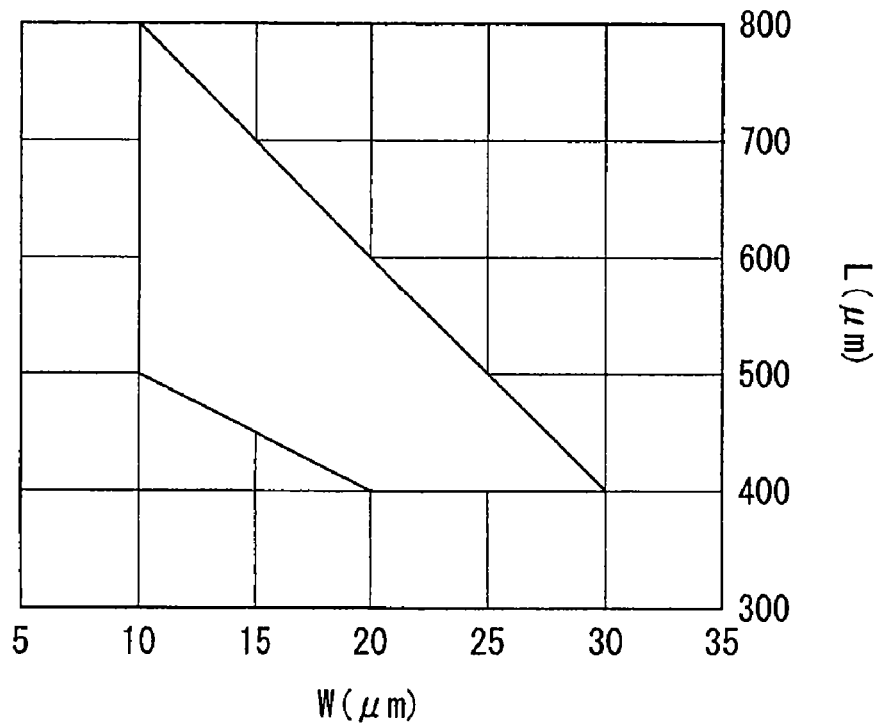
FIG. 27 is a view showing a feasible range of W and L, (W, L) in the case that the output is from 500 mW to less than 700 mW.

In the case that the output is from 500 mW to less than 700 mW, as shown in FIG. 27, (W, L) is in the region surrounded by 4 points of (10 µm, 500 µm), (10 µm, 800 µm), (30 µm, 400 µm), and (20 µm, 400 µm).

Figure 28:
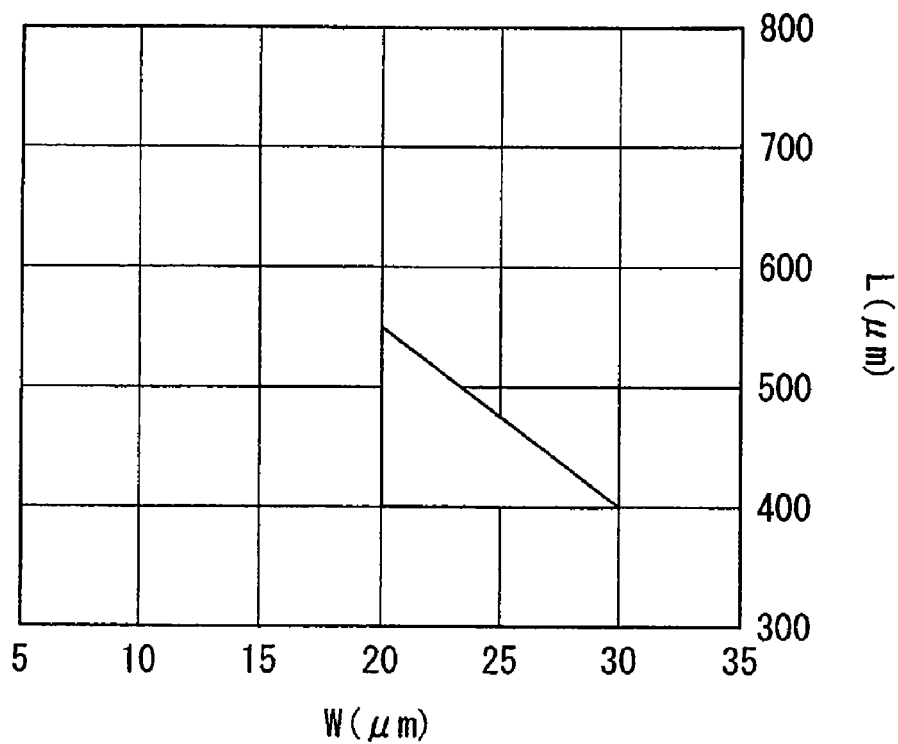
FIG. 28 is a view showing a feasible range of W and L, (W, L) in the case that the output is from 700 mW to less than 900 mW.

In the case that the output is from 700 mW to less than 900 mW, as shown in FIG. 28, (W, L) is in the region surrounded by 3 points of (20 µm, 400 µm), (20 µm, 550 µm), and (30 µm, 400 µm).

Figure 29:
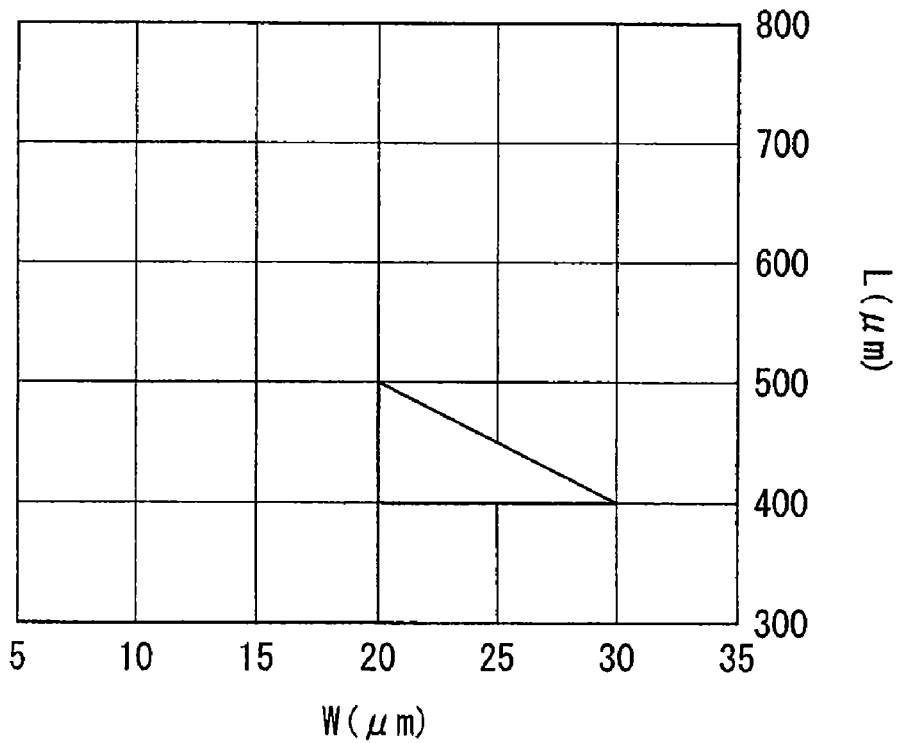
FIG. 29 is a view showing a feasible range of W and L, (W, L) in the case that the output is 900 mW or more.

In the case that the output is 900 mW or more, as shown in FIG. 29, (W, L) is in the region surrounded by 3 points of (20 µm, 400 µm), (20 µm, 500 µm), and (30 µm, 400 µm).

The laser diode can be manufactured, for example, as follows.

First, for example, the substrate 11 made of sapphire being about 400 µm thick is prepared. For example, on the face c of the substrate 11, for example, by ELO (Epitaxial Lateral Overgrowth) method, the n-side contact layer 12 made of the foregoing material with the foregoing thickness is formed.

Next, on the n-side contact layer 12, for example, by MOCVD (Metal Organic Chemical Vapor Deposition) method, the n-type cladding layer 13, the first guiding layer 14, the active layer 15, the second guiding layer 16, the carrier block layer 17, the third guiding layer 18, the p-type cladding layer 19, and the p-side contact layer 20 are sequentially grown.

Subsequently, an unshown mask is formed on the p-side contact layer 20. By utilizing the mask, the p-side contact layer 20 and part of the p-type cladding layer 19 are selectively etched by, for example, RIE (Reactive Ion Etching) to form the upper section of the p-type cladding layer 19 and the p-side contact layer 20 into the strip-shaped ridge 21. Then, the width of the ridge 21 is determined so that the width W of the light emitting region 15A becomes in the range from 5 µm to 30 µm according to desired output based on the foregoing relationship between the output and dimensions of the light emitting region 15A of the active layer 15. Further, when the ridge 21 is formed corresponding to the region with low dislocation density among the n-side contact layer 12 formed by ELO, and the light emitting region 15A is formed in such a region, device characteristics of the laser diode device 10 can be improved.

After that, the p-side contact layer 20, the p-type guiding layer 19, the third guiding layer 18, the carrier block layer 17, the second guiding layer 16, the active layer 15, the first guiding layer 14, the n-type cladding layer 13, and part of the n-side contact layer 12 are sequentially etched to expose the n-side contact layer 12 on the surface. It is possible that after the p-side contact layer 20 is grown, the n-side contact layer 12 is exposed on the surface and then the ridge 21 is formed.

After the n-side contact layer 12 is exposed on the surface, the insulating film 22 is formed on the whole exposed face by, for example, vapor deposition method. After that, for example, by RIE method, an aperture is provided in the insulating layer 22 correspondingly to the p-side contact layer 20. Then, for example, palladium, platinum, and gold are sequentially deposited to form the p-side electrode 41. Further, an aperture is provided in the insulating film 22 correspondingly to the n-side contact layer 12. Then, for example, titanium, platinum, and gold are sequentially deposited to form the n-side electrode 42.

After the p-side electrode 41 and the n-side electrode 42 are formed, the rear face of the substrate 11 is ground so that the thickness becomes, for example, about 80 µm. After the substrate 11 is ground, the length L of the light emitting region 15 is adjusted to a given size so that L is within the range from 300 µm to 800 µm according to desired output. Next, the reflector films are formed on the resonator end faces in the longitudinal direction of the ridge 21. Thereby, the laser diode shown in FIG. 1 is completed.

In the laser diode, when a given voltage is applied between the n-side electrode 42 and the p-side electrode 41, a current is injected into the light emitting region 15A of the active layer 15, and light emitting is generated by electron-hole recombination. The light is reflected by the reflector films on the resonator end faces, travels between them, generates laser oscillation, and is emitted outside as a laser beam. Here, by setting the width W and the length L of the light emitting region 15A to the values in the optimal ranges as described above, high output is obtained with high light efficiency.

As above, in this embodiment, by setting the width W and the length L of the light emitting region 15A to the values in the optimal ranges, high light efficiency can be obtained and blue oscillation with high output can be realized. Therefore, output close to 1 W at maximum can be obtained by the single laser diode device 10, and a high output blue laser smaller than in traditional device can be made. Further, if arrayed, it is possible to obtain over 10 W output. Furthermore, if stacked, it is possible to obtain 100 W or more output. In addition, efficiency and reliability can be improved, it is effective for lowering the driving current, and it is expected to decrease the manufacturing cost. Further, by setting in more detail the width W and the length L of the light emitting region 15A, it is possible to obtain the output with desired power.

Descriptions have been hereinbefore given of the present invention with reference to the embodiment. However, the present invention is not limited to the foregoing embodiment, and various modifications may be made. For example, in the foregoing embodiment, the case in which on the substrate 11 made of sapphire, the n-side contact layer 12 is formed by ELO method, on which the n-type cladding layer 13 and the like are formed, has been described. However, the substrate 11 made of GaN may be used. The substrate 11 made of GaN has little defect, and the crystal quality thereof is favorable. In addition, in the case of using the substrate 11 made of GaN, the laser diode device 10 can be directly formed not using ELO method. Therefore, it is free from the fact that the width W of the light emitting region 15A is limited by the dislocation density distribution of the n-side contact layer 12 formed by ELO. Consequently, using the substrate 11 made of GaN is advantageous to widen the width W to the range from 5 μm to 30 μm as in the present invention.

In addition, for example, in the foregoing embodiment, the parameter values used for the simulation have been described with specific examples (refer to Table 1). However, even if the parameter values slightly vary from the values in Table 1, the relation between the appropriate range of (W, L) and the output of the present invention can be maintained.

Further, the material, the thickness, the deposition methods, the deposition conditions and the like of the respective layers described in the foregoing embodiment are not limited, but other material, other thickness, other deposition method, and other deposition conditions may be used. For example, in the foregoing embodiment, the materials of the layers from the n-side contact layer 12 to the p-side contact layer 20 have been described with specific examples. However, these layers may be made of other nitride Group III-V compound semiconductor containing at least one of aluminum (Al), gallium (Ga), and indium (In) among Group 3B elements and nitrogen (N) among Group 5B elements.

Further, for example, in the foregoing embodiment, the case in which the layers from the n-side contact layer 12 to the p-side contact layer 20 are formed by MOCVD method has been described. However, the layers may be formed by other organic metal vapor-phase deposition method such as MOVPE method, or by MBE (Molecular Beam Epitaxy) method and the like.

In addition, for example, in the foregoing embodiment, the structure of the laser diode device 10 has been described with the specific example. However, it is not necessary to provide all layers, or other layer may be further provided.

It should be understood by those skilled in the art that various modifications, combinations, sub-combinations and alternations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A laser diode device comprising:
   a semiconductor layer which includes an active layer and a carrier blocking layer disposed on a p-side of the active layer, and is made of a nitride Group III-V compound semiconductor containing at least one of aluminum, gallium, and indium among Group 3B elements and nitrogen among Group 5B elements,
   wherein when output of laser light is set to be from about 200 mW to less than about 300 mW the W and L of the light emitting region satisfy the following conditions:
   (a) W ranges from 5 μm to 15 μm;
   (b) L ranges from 300 μm to 800 μm; and
   (c) $L \leq -40*W+1,000$.

2. The laser diode device according to claim 1, wherein the active layer has a multiple quantum well structure in which a barrier layer made of GaN and a well layer made of an $In_xGa_{1-x}N$ mixed crystal (0<x<1) are alternately layered.

3. The laser diode device according to claim 1, wherein the active layer has a multiple quantum well structure in which a barrier layer made of GaN and a well layer made of an $In_{0.1}Ga_{0.9}N$ mixed crystal are alternately layered.

4. A laser diode device comprising:
   a semiconductor layer which includes an active layer and a carrier blocking layer disposed on a p-side of the active layer, and is made of a nitride Group III-V compound semiconductor containing at least one of aluminum, gallium, and indium among Group 3B elements and nitrogen among Group 5B elements,
   wherein when output of laser light is set to be from about 300 mW to less than about 400 mW the W and L of the light emitting region (W, L) satisfy the following conditions:
   (a) W ranges from 5 μm to 20 μm;
   (b) L ranges from 300 μm to 800 μm; and
   (c) $L \leq -40*W+1,200$.

5. A laser diode device comprising:
   a semiconductor layer which includes an active layer and a carrier blocking layer disposed on a p-side of the active layer, and is made of a nitride Group III-V compound semiconductor containing at least one of aluminum, gallium, and indium among Group 3B elements and nitrogen among Group 5B elements,
   wherein when output of laser light is set to be from about 400 mW to less than about 500 mW the W and L of the light emitting region (W, L) satisfy the following conditions:
   (a) W ranges from 5 μm to 30 μm;
   (b) L ranges from 300 μm to 800 μm;
   (c) $L \leq -20*W+1,000$;
   (d) $L \geq 10*W+100$;
   (e) $L \geq -10*W+500$; and
   (f) $L \geq -40*W+800$.

6. A laser diode device comprising:

a semiconductor layer which includes an active layer and a carrier blocking layer disposed on a p-side of the active layer, and is made of a nitride Group III-V compound semiconductor containing at least one of aluminum, gallium, and indium among Group 3B elements and nitrogen among Group 5B elements, wherein when output of laser light is set to be from about 500 mW to less than about 700 mW the W and L of the light emitting region (W, L) satisfy the following conditions:

(a) W ranges from 10 μm to 30 μm;
(b) L ranges from 400 μm to 800 μm;
(c) $L \leq -20*W+1{,}000$; and
(d) $L \geq -10*W+600$.

7. A laser diode device comprising:

a semiconductor layer which includes an active layer and a carrier blocking layer disposed on a p-side of the active layer, and is made of a nitride Group III-V compound semiconductor containing at least one of aluminum, gallium, and indium among Group 3B elements and nitrogen among Group 5B elements, wherein when output of laser light is set to be from about 700 mW to less than about 900 mW the W and L of the light emitting region (W, L) satisfy the following conditions:

(a) W ranges from 20 μm to 30 μm;
(b) L ranges from 400 μm to 550 μm; and
(c) $L \leq -15*W+850$.

8. A laser diode device comprising:

a semiconductor layer which includes an active layer and a carrier blocking layer disposed on a p-side of the active layer, and is made of a nitride Group III-V compound semiconductor containing at least one of aluminum, gallium, and indium among Group 3B elements and nitrogen among Group 5B elements, wherein when output of laser light is set to be from about 500 mW to less than about 700 mW the W and L of the light emitting region (W, L) satisfy the following conditions:

(a) W ranges from 20 μm to 30 μm;
(b) L ranges from 400 μm to 500 μm; and
(c) $L \leq -10*W+70$ .

* * * * *